(12) United States Patent
Chang et al.

(10) Patent No.: US 12,165,969 B2
(45) Date of Patent: Dec. 10, 2024

(54) INTEGRATED CIRCUIT DEVICE AND METHOD

(71) Applicant: TAIWAN SEMICONDUCTOR MANUFACTURING COMPANY, LTD., Hsinchu (TW)

(72) Inventors: Yu-Jung Chang, Hsinchu (TW); Nien-Yu Tsai, Hsinchu (TW); Min-Yuan Tsai, Hsinchu (TW); Wen-Ju Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 265 days.

(21) Appl. No.: 17/576,909

(22) Filed: Jan. 14, 2022

(65) Prior Publication Data
US 2022/0399269 A1    Dec. 15, 2022

Related U.S. Application Data

(60) Provisional application No. 63/215,009, filed on Jun. 25, 2021, provisional application No. 63/208,702, filed on Jun. 9, 2021.

(51) Int. Cl.
*H01L 23/522* (2006.01)
*H01L 21/768* (2006.01)
*H01L 23/00* (2006.01)

(52) U.S. Cl.
CPC .... *H01L 23/5226* (2013.01); *H01L 21/76802* (2013.01); *H01L 21/76877* (2013.01); *H01L 24/05* (2013.01); *H01L 24/13* (2013.01); *H01L 2224/02331* (2013.01); *H01L 2224/02381* (2013.01); *H01L 2224/0401* (2013.01)

(58) Field of Classification Search
CPC ........... H01L 23/5226; H01L 21/76802; H01L 21/76877; H01L 24/05; H01L 24/13; H01L 2224/02331; H01L 2224/02381; H01L 2224/0401; H01L 23/60; H01L 23/562; H01L 23/585; H01L 24/02
See application file for complete search history.

(56) References Cited

U.S. PATENT DOCUMENTS 7,260,442 B2    8/2007  Hwang et al.
9,256,709 B2    2/2016  Yu et al.
(Continued)

OTHER PUBLICATIONS

Office Action dated Jul. 11, 2023 for corresponding case No. TW 111120643. (pp. 1-8).

*Primary Examiner* — Karen Kusumakar
*Assistant Examiner* — Shawn Shaw Muslim
(74) *Attorney, Agent, or Firm* — Hauptman Ham, LLP

(57) ABSTRACT

An IC device includes an interlayer dielectric (ILD), a first tower structure embedded in the ILD, and a first ring region including a portion of the ILD that extends around the first tower structure. The first tower structure includes a plurality of first conductive patterns in a plurality of metal layers, and a plurality of first vias between the plurality of metal layers along a thickness direction of the IC device. The plurality of first conductive patterns and the plurality of first vias are coupled to each other to form the first tower structure. The plurality of first conductive patterns is confined by the first ring region, without extending beyond the first ring region. The first tower structure is a dummy tower structure.

20 Claims, 18 Drawing Sheets

(56) References Cited

U.S. PATENT DOCUMENTS

| | | | |
|---|---|---|---|
| 2009/0134500 A1* | 5/2009 | Kuo | .................. H01L 23/66 |
| | | | 257/659 |
| 2013/0134559 A1* | 5/2013 | Lin | .................. H01L 21/486 |
| | | | 257/E23.179 |
| 2014/0040838 A1 | 2/2014 | Liu et al. | |
| 2015/0235922 A1* | 8/2015 | Chen | ............. H01L 23/53295 |
| | | | 257/383 |
| 2015/0278429 A1 | 10/2015 | Chang | |
| 2018/0151463 A1 | 5/2018 | Venugopal et al. | |

* cited by examiner

INTEGRATED CIRCUIT DEVICE AND METHOD

PRIORITY CLAIM

The present application claims the priority of U.S. Provisional Application No. 63/208,702, filed on Jun. 9, 2021, and U.S. Provisional Application No. 63/215,009, filed on Jun. 25, 2021, both of which are incorporated herein by reference in their entireties.

BACKGROUND

The semiconductor industry has experienced rapid growth due to ongoing improvements in integration density of a variety of components (e.g., photoelectric devices, electrical components, or the like). To accommodate the miniaturized scale of semiconductor devices, also referred to as integrated circuit (IC) devices, various technologies and applications are developed for wafer-level packaging, involving greater numbers of different components with different functions. Improvements in integration density permit more components to be integrated into a given area.

As such, fabrication of the semiconductor device involves many steps and operations on such a small and thin semiconductor device. Therefore, the manufacturing of the semiconductor device at a miniaturized scale becomes more complicated. Further, greater numbers of different components with different materials are involved, resulting in greater demands on thermal management and heat dissipation efficiency due to high power density of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
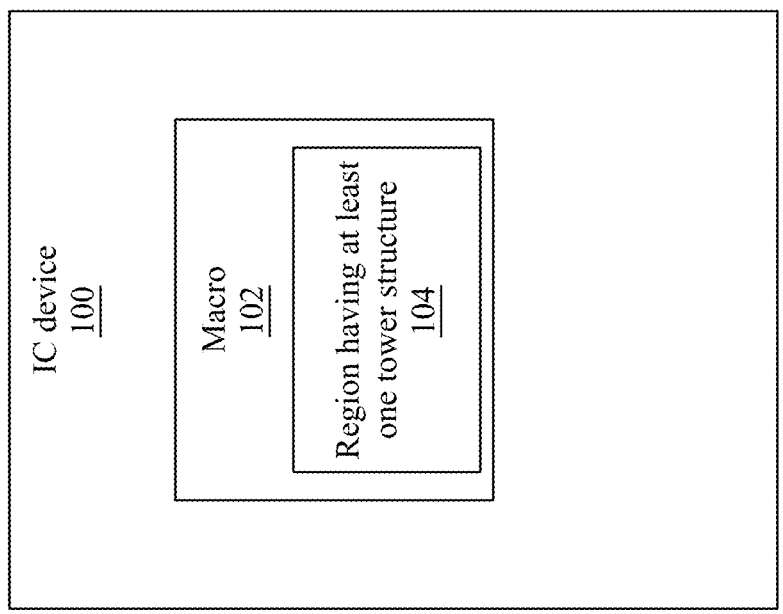
FIG. 1A is a block diagram of an IC device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an IC device comprises tower structures including conductive patterns and vias under an area configured to receive one or more bumps for physically and electrically coupling the IC device to one or more other devices. The IC device further comprises ring regions each extending around a corresponding tower structure, to physically and electrically isolate conductive patterns of the corresponding tower structure from conductive patterns of other tower structures. In at least one embodiment, one or more of the tower structures are dummy tower structures which are electrically disconnected from, or otherwise do not affect operation or functionality of, functional circuitry of the IC device. In one or more embodiments, the tower structures provide the IC device with a sufficient mechanical strength to sustain stress from the one or more bumps that physically and electrically couple the IC device to an external device. In at least one embodiment, the ring regions limit electrical charges accumulated during manufacture to the individual tower structures, thereby preventing a large amount of electrical charges from being accumulated. As a result, it is possible to avoid "plasma induced gate oxide damage" or "antenna effect" in at least one embodiment. In some embodiments, the ability to meet both mechanical strength and antenna effect requirements results in one or more further advantages including, but not limited to, improved electrical overstress (EOS) protection, reduced leakage, improved yield, improved bumping success rate, minimal changes to seed dummy metal placement, or the like.

FIG. 1A is a block diagram of an IC device 100, in accordance with some embodiments.

In FIG. 1A, the IC device 100 comprises, among other things, a macro 102. In some embodiments, the macro 102 comprises one or more of a memory, a power grid, a cell or cells, an inverter, a latch, a buffer and/or any other type of circuit arrangement that may be represented digitally in a cell library. In some embodiments, the macro 102 is understood in the context of an analogy to the architectural hierarchy of modular programming in which subroutines/procedures are called by a main program (or by other subroutines) to carry out a given computational function. In this context, the IC device 100 uses the macro 102 to perform one or more given functions. Accordingly, in this context and in terms of architectural hierarchy, the IC device 100 is analogous to the main program and the macro 102 is analogous to subroutines/procedures. In some embodiments, the macro 102 is a soft macro. In some embodiments, the macro 102 is a hard macro. In some embodiments, the macro 102 is a soft macro which is described digitally in register-transfer level (RTL) code. In some embodiments, synthesis, placement and routing have yet to have been performed on the macro 102 such that the soft macro can be synthesized, placed and routed for a variety of process nodes. In some embodiments, the macro 102 is a hard macro which is described digitally in a binary file format (e.g., Graphic Database System II (GDSII) stream format), where the binary file format represents planar geometric shapes, text labels, other information and the like of one or more layout-diagrams of the macro 102 in hierarchical form. In some embodiments, synthesis, placement and routing have been performed on the macro 102 such that the hard macro is specific to a particular process node.

The macro 102 includes a region 104 which comprises at least one tower structure as described herein. In some embodiments, the region 104 comprises a semiconductor substrate having circuitry formed thereon, in a front-end-of-line (FEOL) fabrication. Furthermore, above and/or below the semiconductor substrate, the region 104 comprises various metal layers that are stacked over and/or under insulating layers in a Back End of Line (BEOL) fabrication. The BEOL provides routing for circuitry of the IC device 100.

Figure 1B:
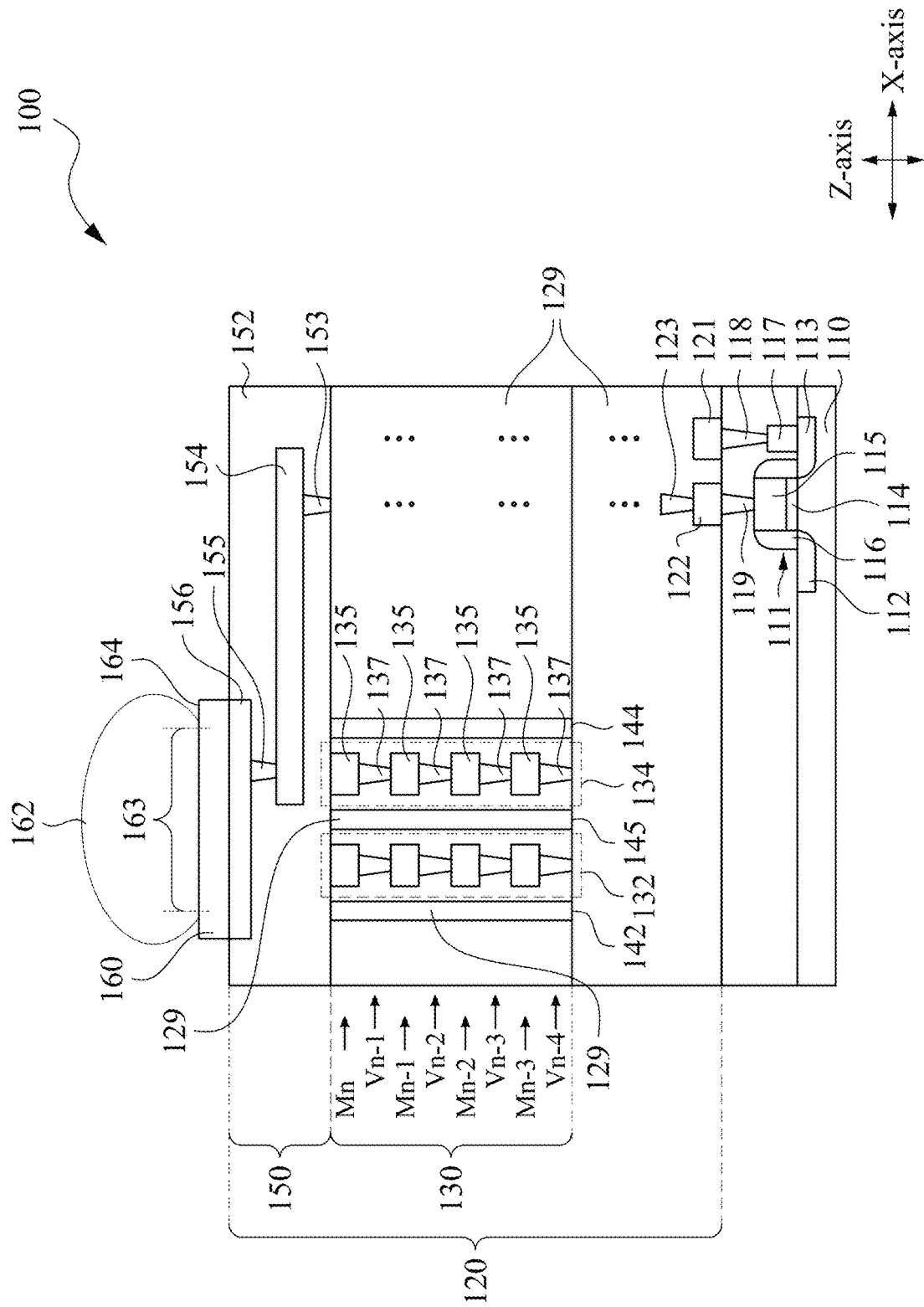
FIG. 1B is a schematic cross-sectional view of a portion of an IC device, in accordance with some embodiments.

FIG. 1B is a schematic cross-sectional view of a portion of the IC device 100, in accordance with some embodiments. In at least one embodiment, the portion of the IC device 100 illustrated in FIG. 1B corresponds to a portion of the region 104 in FIG. 1A.

The IC device 100 comprises a substrate 110 over which functional circuitry of the IC device 100 is formed. The functional circuitry of the IC device 100 comprises a plurality of circuit elements electrically coupled together to perform one or more operations or functionality. Examples of circuit elements include, but are not limited to, transistors and diodes. Examples of transistors include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

In FIG. 1B, a transistor 111 is illustrated as an example circuit element of the functional circuitry of the IC device 100. The transistor 111 comprises source/drain regions 112, 113 which are P-doped or N-doped regions formed by P-type or N-type dopants added to the substrate 110. In some embodiments, P-doped or N-doped regions are formed in N-wells or P-wells. In some embodiments, isolation structures are formed between adjacent P well/P-doped regions and N well/N-doped regions. For simplicity, isolation structures are omitted from FIG. 1B. The transistor 111 further comprises a gate stack including a gate dielectric layer 114, and a gate electrode 115. In at least one embodiment, the gate dielectric layer comprises multiple gate dielectric layers. Example materials of the gate dielectric layer or layers include HfO2, ZrO2, or the like. Example materials of the gate electrode 115 include polysilicon, metal, or the like. Spacers 116 are formed on sidewalls of the gate stack. Example materials of the spacers 116 include, but are not limited to, silicon nitride, oxynitride, silicon carbide, or the like. Contact structures, sometimes referred to as metal-to-device (MD) structures, are formed over the source/drain regions of the transistor 111 to define an electrical connection from the transistor 111 to other circuit elements. In FIG. 1B, a MD contact structure 117 is illustrated as being over and electrically coupled to the source/drain region 113. An MD contact structure over and electrically coupled to the source/drain region 112 is omitted for simplicity. A via 118 is over and in electrical contact with the MD contact structure 117. The via 118 is sometimes referred to as a via-to-device (VD). A via 119 is over and in electrical contact with the gate region 115. The via 119 is sometimes referred to as via-to-gate (VG). An example material of the VD and VG vias includes metal. In the example configuration in FIG. 1B, the source/drain regions 112, 113 and the gate stack are arranged along an X-axis, and the gate electrode 115 extends along a direction transverse to the X-axis as described herein. Other configurations are within the scopes of various embodiments.

The IC device 400 further comprises an interconnect structure 120 over the substrate 110 along a thickness direction of the substrate 110, which is also a thickness direction of the IC device 100 and is indicated as Z-axis in FIG. 1B. The interconnect structure 120 comprises a plurality of metal layers and via layers sequentially and alternatingly arranged over the VD, VG vias along the Z-axis. The interconnect structure 120 further comprises an inter-layer dielectric (ILD) 129 in which the metal layers and via layers are embedded. The lowermost metal layer immediately over and in electrical contact with the VD, VG vias is an M0 (metal-zero) layer, a next metal layer immediately over the M0 layer is an M1 layer, a next metal layer immediately over the M1 layer is an M2 layer, or the like. Conductive patterns in the M0 layer are referred to as M0 conductive patterns, conductive patterns in the M1 layer are referred to as M1 conductive patterns, or the like. A via layer Vi is arranged between and electrically couple the M1 layer and the M1+1 layer, where i is an integer from zero and up. For example, a via-zero (V0) layer is the lowermost via layer which is arranged between and electrically couple the M0 layer and the M1 layer. Other via layers are V1, V2, or the like. Vias in the V0 layer are referred to as V0 vias, vias in the V1 layer are referred to as V1 vias, or the like. An example material of various metal layers and via layers includes metal. Other configurations are within the scopes of various embodiments. In the example configuration in FIG. 1B, M0 conductive patterns 121, 122 are correspondingly over and in electrical contact with the VD via 118 and VG via 119, and a V0 via 123 is over and in electrical contact with the M0 conductive pattern 122. Further conductive patterns and/or vias are included to electrically couple the transistor 111 to other circuit elements, but are omitted in FIG. 1B for simplicity.

The IC device 100 further comprises, in the interconnect structure 120, a region 130 in which one or more tower structures for improving a mechanical strength of the IC device in a bumping process is provided. In some embodiments, the region 130 is also referred to as the bump receiving region. In the example configuration in FIG. 1B, two tower structures 132, 134 are illustrated. Each of the tower structures 132, 134 is embedded or buried in the ILD 129, and comprises a plurality of conductive patterns in a plurality of metal layers, and a plurality of vias between the plurality of metal layers along the thickness direction of the IC device 100. For example, the tower structure 134 comprises conductive patterns, commonly designated as 135, in metal layers Mn-3 to Mn, and vias, commonly designated as 135, in via layers Vn-4 to Vn-1, where n is a natural number not smaller than 4. The conductive patterns 135 and the vias 137 are embedded or buried in the ILD 129. The conductive patterns 135 and the vias 137 are physically coupled to each other in sequence to form the tower structure 134. The tower structure 132 is configured similarly. The described numbers of metal layers and/or via layers included in the tower structures 132, 134 are examples. Other numbers of metal layers and/or via layers included in a tower structure are within the scopes of various embodiments. The illustrated configuration in which each tower structure includes a conductive pattern in each metal layer and a via in each via layer is an example. Other configurations are within the scopes of various embodiments. For example, in one or more embodiments, each tower structure has multiple conductive patterns in each metal layer and/or multiple vias in each via layer. The illustrated configuration in which a conductive pattern 135 is at a top and a via 137 is at a bottom of each tower structure is an example. Other configurations are within the scopes of various embodiments. For example, a tower structure may have a conductive pattern or a via at its top and/or a conductive pattern or a via at its bottom, in accordance with some embodiments.

In the example configuration in FIG. 1B, the region 130 with the tower structures does not overlap the functional circuitry of the IC device 100 in the thickness direction, i.e., along the Z-axis. For example, in a plan view of the substrate 110, the region 130 with the tower structures is arranged in a peripheral portion of the IC device 100, the functional circuitry of the IC device 100 is arranged in middle portion of the IC device 100, and the peripheral portion extends around the middle portion. Other configurations are within the scopes of various embodiments. In some embodiments, at least one of the tower structures in the region 130 overlaps a part of the functional circuitry of the IC device 100 in the thickness direction.

In some embodiments, the tower structures 132, 134 are dummy tower structures which are electrically disconnected from, or otherwise do not affect operation or functionality of, the functional circuitry of the IC device. For example, the Vn-4 via 137 at the bottom of the tower structure 134 and the Mn conductive pattern 135 at the top of the tower structure 134 are buried in corresponding dielectric layers of the ILD 129, and are electrically isolated from conductive elements other than the conductive patterns and vias of the tower structure 134 by the ILD 129. The tower structure 132 is electrically isolated from conductive elements other than the conductive patterns and vias of the tower structure 132 in a similar manner. In some embodiments, all tower structures in the peripheral portion of the IC device 100 are dummy tower structures. In at least one embodiment, conductive patterns in a dummy tower structure are floating.

In some embodiments, at least one tower structure in the region 130 is an active or functional tower structure. For example, when the tower structure 134 is a functional tower structure, the Vn-4 via 137 at the bottom of the tower structure 134 is electrically coupled to a circuit element in the functional circuitry of the IC device 100, and the Mn conductive pattern 135 at the top of the tower structure 134 is electrically coupled to a contact pad through a redistribution layer (RDL) as described herein.

The IC device 100 further comprises one or more ring regions each extending around a corresponding one of the tower structures in the region 130. In the example configuration in FIG. 1B, the IC device 100 comprises ring regions 142, 144 extending correspondingly around tower structures 132, 134. The ring regions 142, 144 share a common boundary region 145. A more detailed description of one or more ring regions is given with respect to FIGS. 2B-2C.

The conductive patterns constituting each tower structure are confined by the corresponding ring region, without extending beyond the corresponding ring region. For example, the conductive patterns 135 of the tower structure 134 are confined by the ring region 144, and do not extend outwardly beyond the ring region 144. The illustrated configuration in FIG. 1B where the conductive patterns 135 of the tower structure 134 terminate without reaching the ring region 144 is an example. In at least one embodiment, one or more of the conductive patterns 135 extend into a part of the ring region 144, and terminate in the ring region 144. The conductive patterns of the tower structure 132 are similarly confined by the ring region 142, and do not extend beyond the ring region 142. Each of the ring regions 142, 144 comprises a portion of the ILD 129 that extends around the corresponding tower structure 132, 134. In some embodiments, one or more of the ring regions 142, 144 contain no conductive patterns and no vias embedded in the corresponding portions of the ILD 129. In at least one embodiment, one or more of the ring regions 142, 144 comprise conductive patterns and/or vias which belong to one or more of the corresponding metal layers Mn-3 to Mn and/or via layers Vn-4 to Vn-1, and which are embedded in the corresponding portions of the ILD 129.

The IC device 100 further comprises a redistribution layer (RDL) 150 over the tower structures 132, 134, and a under-bump-metallurgy (UBM) structure 160 over the RDL 150. The RDL 150 is a part of the interconnect structure 120, and is configured to electrically couple the UBM structure 160 to the functional circuitry of the IC device 100. In the example configuration in FIG. 1B, the RDL 150 comprises an ILD 152 and, in the ILD 152, a via 153, a conductive pattern 154, a further via 155, and a contact pad 156. The via 153 is electrically coupled to the functional circuitry of the IC device 100, by a series of conductive patterns and vias in various metal layers and via layers of the interconnect structure 120, including the metal layers Mn-3 to Mn and via layers Vn-4 to Vn-1 in which the tower structures 132, 134 are formed. For example, the via 153 is electrically coupled to the via 123, and is thereby, electrically coupled to the gate electrode 115 of the transistor 111. The via 153 is electrically coupled to the contact pad 156 through the conductive pattern 154 and the via 155. Example materials of the contact pad 156 include, but are not limited to, aluminum, copper, silver, gold, tungsten, nickel, alloys thereof, multilayers thereof, or the like.

In some embodiments, the IC device 100 further comprises a passivation layer (not shown) in which the contact pad 156 and/or the UBM structure 160 is/are partially embedded. Example materials of the passivation layer include, but are not limited to, silicon nitride (SiN), silicon dioxide (SiO2), silicon oxynitride (SiON), un-doped silicate glass (USG), polymer, multi-layers thereof, or the like. Example polymers include, but are not limited to, epoxy, polyimide, benzocyclobutene (BCB), polybenzoxazole (PBO), multi-layers thereof, or the like.

The UBM structure 160 is over and in electrical contact with the contact pad 156, and therefore, the UBM structure 160 is electrically coupled to the functional circuitry, e.g., to the gate electrode 115 of the transistor 111, through the RDL 150. The UBM structure 160 is configured to receive a bump 162 for physically and electrically coupling the IC device 100 to another, external device. The bump 162 has a bumping area 163 which corresponds to the foot print of the bump 162 on an upper surface 164 of the UBM structure 160. Example materials of the UBM structure 160 include, but are not limited to, one or more layers of copper, tantalum, titanium, nickel, copper, alloys thereof, or the like. Example materials of the bump 162 include, but are not limited to, one or more layers of solder, tin, lead, copper, gold, silver, zinc, bismuth, magnesium, antimony, indium, alloys thereof, or the like. In the example configuration in FIG. 1B, the RDL 150 and UBM structure 160 are electrically coupled with each other, and are electrically isolated from the tower structures 132, 134.

The UBM structure 160 overlaps at least one of the tower structures 132, 134 in the thickness direction. As a result, in at least one embodiment, the at least one of the tower structures 132, 134 is configured to withstand at least a portion of the stress applied from the bump 162, thereby contributing to the mechanical strength of the IC device 100 in a bumping process with increased yield. The illustrated configuration where the UBM structure 160 overlaps, in the thickness direction, multiple adjacent tower structures 132, 134 and the common boundary region 145 between the adjacent tower structures 132, 134 is an example. Other configurations are within the scopes of various embodiments, for example, as described with respect to FIGS. 5A-5C.

In a manufacturing process of the IC device 100, circuit elements, such as one or more transistors 111, are formed over the substrate 110. Subsequent to the formation of transistors, various dielectric and metal layers are deposited and patterned to obtain vias and/or conductive patterns electrically coupled to the gate electrodes of the transistors. Deposition and/or patterning operations often include plasma operations, such as plasma etching operations, plasma deposition operations, or the like. In plasma operations, it is possible that a sufficient amount of electrical charges is accumulated on a conductive pattern or via coupled to a gate electrode, e.g., the gate electrode 115, and causes breakdown of the underlying gate dielectric material, e.g., the gate dielectric layer 114, with further damage to the corresponding transistor. This issue is referred to as "plasma induced gate oxide damage" or "antenna effect," and is avoidable, in one or more embodiments, by the ring regions 142, 144 which extend around the corresponding tower structures 132, 134 and limit electrical charges accumulated during manufacture to the individual tower structures, thereby preventing a large amount of electrical charges from being accumulated.

Figure 2A:
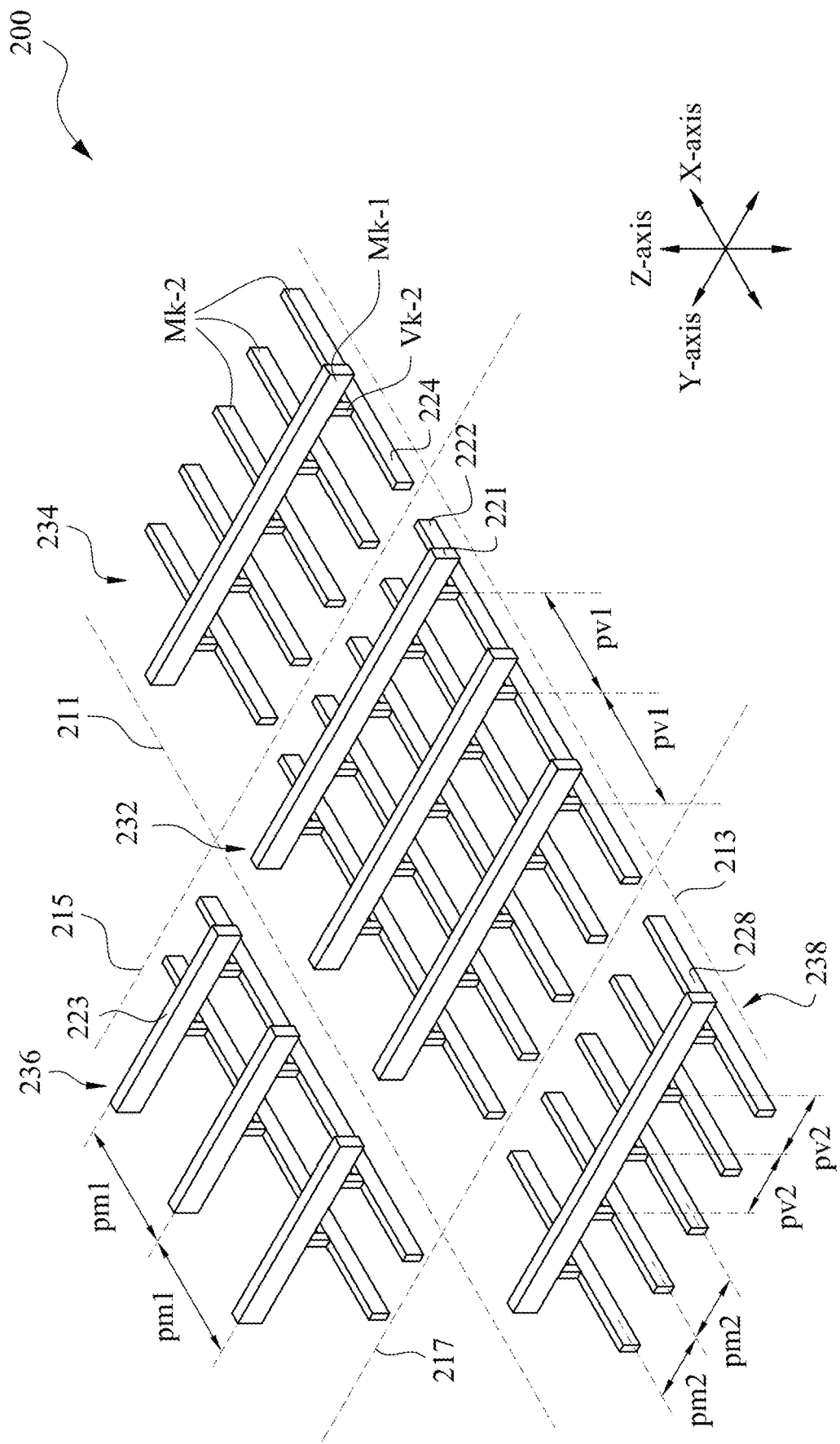
FIGS. 2A-2D are schematic perspective views of various regions of IC devices, in accordance with some embodiments.

FIG. 2A is an enlarged schematic perspective view of a region of an IC device 200, in accordance with some embodiments. In some embodiments, the IC device 200 corresponds to the IC device 100 and/or the region of the IC device 200 in FIG. 2A corresponds to the region 130 described with respect to FIG. 1B.

The IC device 200 comprises a plurality of tower structures 232, 234, 236, 238. In some embodiments, the tower structures 232, 234 correspond to the tower structures 132, 134. The tower structure 232 is adjacent to and arranged between the tower structures 234, 238 along the X-axis. The tower structure 232 is adjacent to the tower structure 236 along a Y-axis transverse to the X-axis. In at least one embodiment, the IC device 200 comprises further tower structures which are not illustrated in FIG. 2A, for simplicity. For example, in one or more embodiments, the tower structure 232 is adjacent to and arranged between the tower structure 236 and another tower structure (not shown) along the Y-axis. Each tower structure among the tower structures 232, 234, 236, 238 comprises multiple conductive patterns in a metal layer Mk-1, multiple conductive patterns in a underlying metal layer Mk-2, and multiple vias in a via layer Vk-2 between the metal layers Mk-1, Mk-2. The specific number of conductive patterns in each metal layer and/or the specific number of vias in the metal layer are example, and other numbers of conductive patterns and/or vias are within the scopes of various embodiments. For simplicity, not all conductive patterns and vias of the tower structures 234, 236, 238 are illustrated in FIG. 2A. Each of the metal layers Mk-1, Mk-1, and via layer Vk-2 is one of the metal or via layers used for forming a region containing tower structures, e.g., a region corresponding to the region 130.

In each metal layer, the conductive patterns are elongated along one direction and are arranged at a metal pitch along the transverse direction. For example, in the metal layer Mk-2, the conductive patterns are elongated along the X-axis, and are arranged along the Y-axis at a metal pitch pm2. In the metal layer Mk-1, the conductive patterns are elongated along the Y-axis, and are arranged along the X-axis at a metal pitch pm1. The vias in the via layer are arranged at corresponding via pitches along the transverse directions. For example, in the via layer Vk-2, the vias are arranged at a first via pitch pv1 along the X-axis and at a second via pitch pv2 along the Y-axis. In some embodiments, a metal pitch or a via pitch is a center-to-center distance correspondingly between two adjacent conductive patterns or between two adjacent vias.

In FIG. 2A, lines 211, 213, 215, 217 schematically represent a ring region 242 (illustrated in FIG. 2B) that surrounds the tower structure 232. Specifically, the lines 211, 213 extend along the X-axis and separate the tower structure 232 from the corresponding tower structure 236 and another tower structure (not shown). The lines 215, 217 extend along the Y-axis and separate the tower structure 232 from the corresponding tower structures 234, 238. In at least one embodiment, the line 215 schematically represents a common boundary region corresponding to the common boundary region 145.

In the same metal layer, a conductive pattern of one tower structure is aligned with and physically disconnected from a corresponding conductive pattern of an adjacent tower structure. For example, in the metal layer Mk-2 and across the boundary region corresponding to the line 215, the tower structure 232 has a conductive pattern 222 which is aligned along the X-axis with a corresponding conductive pattern 224 in the tower structure 234, and the aligned conductive patterns 222, 224 are physically disconnected from each other. Similarly, in the metal layer Mk-2 and across a boundary region corresponding to the line 217, the conductive pattern 222 of the tower structure 232 is aligned along the X-axis with a corresponding conductive pattern 228 in the tower structure 238, and the aligned conductive patterns 222, 228 are physically disconnected from each other. The conductive patterns 222, 224, 228 are considered aligned when they overlap each other at least partially when seen along the X-axis. In the metal layer Mk-2, other conductive patterns of the tower structure 232 are aligned with and physically disconnected from corresponding conductive patterns of the tower structures 234, 238. For a further example, in the metal layer Mk-1 and across a boundary region corresponding to the line 211, a conductive pattern 221 of the tower structure 232 is aligned along the Y-axis with a corresponding conductive pattern 223 in the tower structure 236, and the aligned conductive patterns 221, 223 are physically disconnected from each other. The conductive patterns 221, 223 are considered aligned when they overlap each other at least partially when seen along the Y-axis. In the metal layer Mk-1, other conductive patterns of the tower structure 232 are aligned with and physically disconnected from corresponding conductive patterns of the tower structure 236. As a result, the conductive patterns in the tower structure 232 are confined by the corresponding ring region, in a manner similar to that described with respect to FIG. 1B. In at least one embodiment, the conductive patterns in the other tower structures 234, 236, 238 are similarly confined by the corresponding ring regions.

Figure 2B:
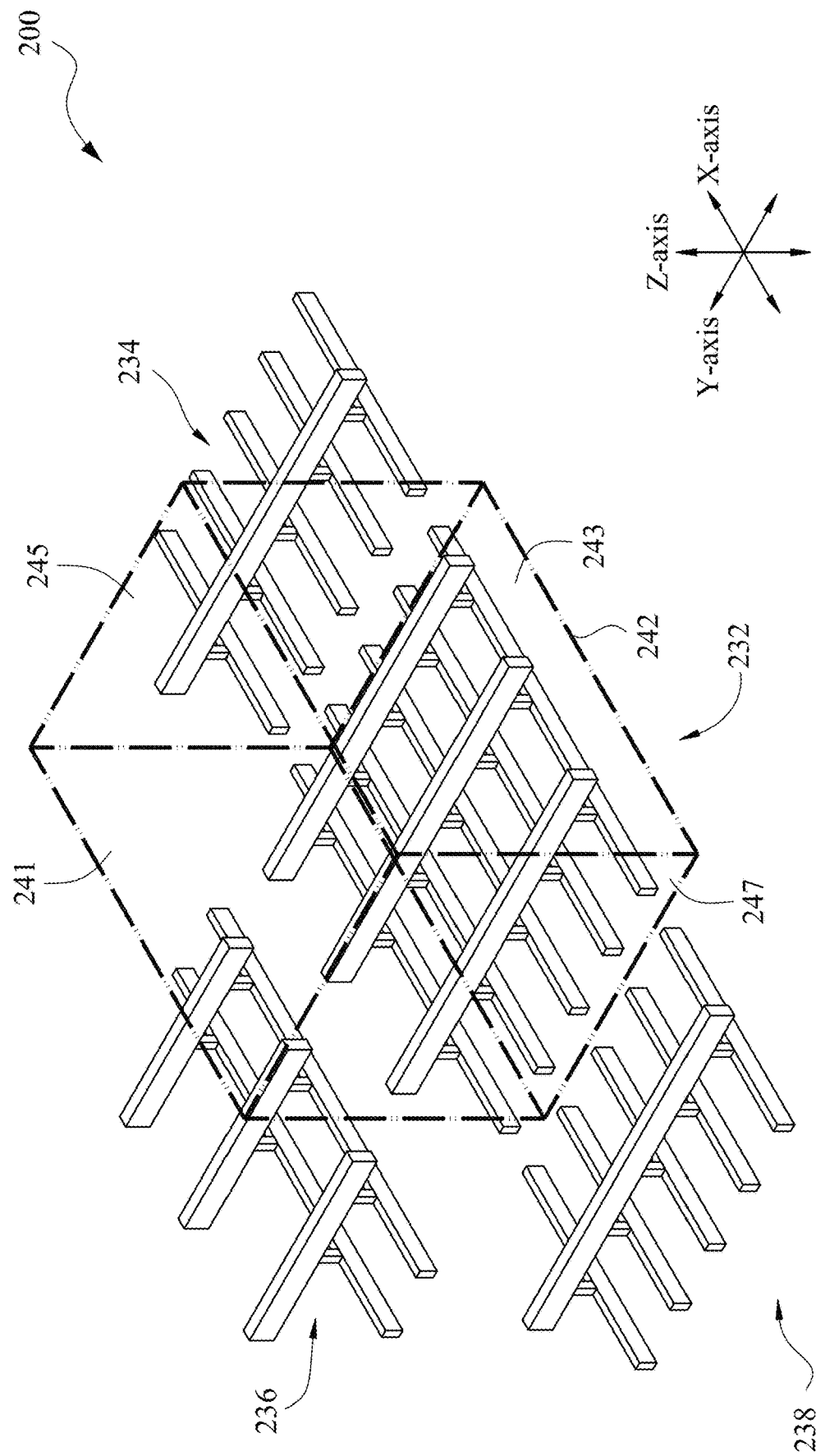

FIG. 2B is an enlarged schematic perspective view of a region of the IC device 200 as in FIG. 2A, in accordance with some embodiments. In FIG. 2B, a ring region 242 corresponding to the ring region 142 is additionally schematically illustrated. The ring region 242 comprises boundary regions 241, 243, 245, 247 corresponding to the lines 211, 213, 215, 217 in FIG. 2A. The boundary regions 241, 243, 245, 247 include a dielectric material of an ILD corresponding to the ILD 129, and together form a portion of the ILD that extends around the tower structure 232.

Figure 2D:
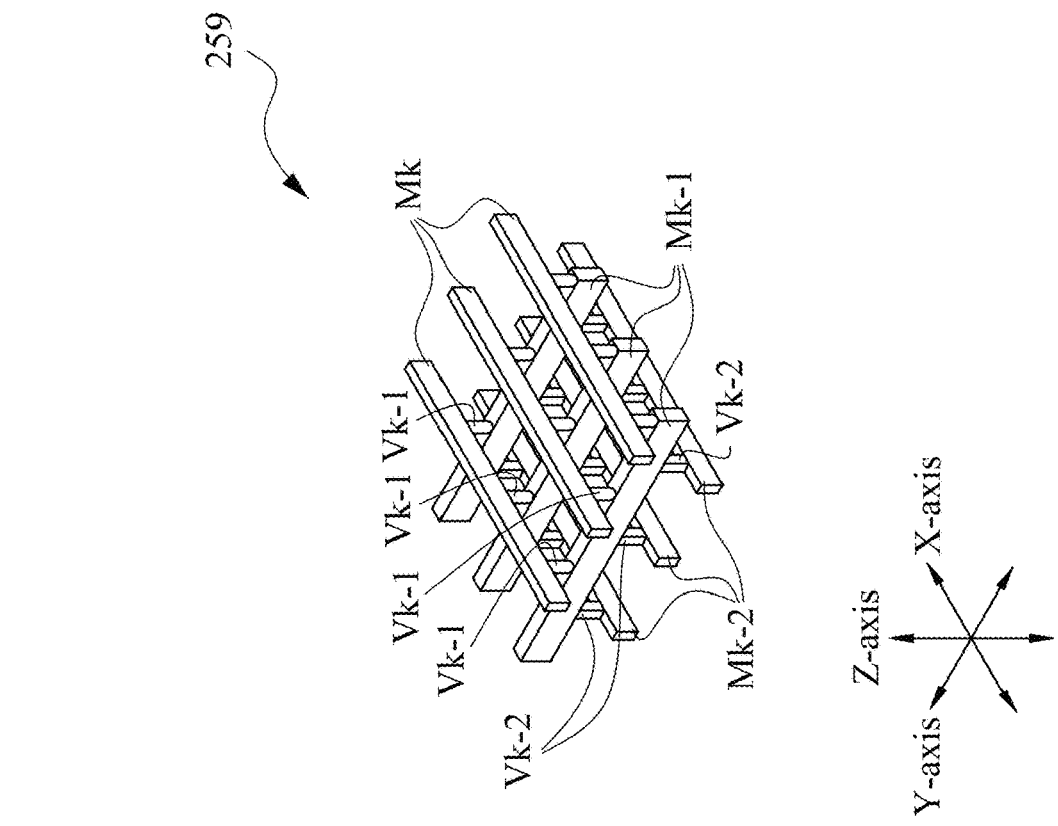
Figure 2C:
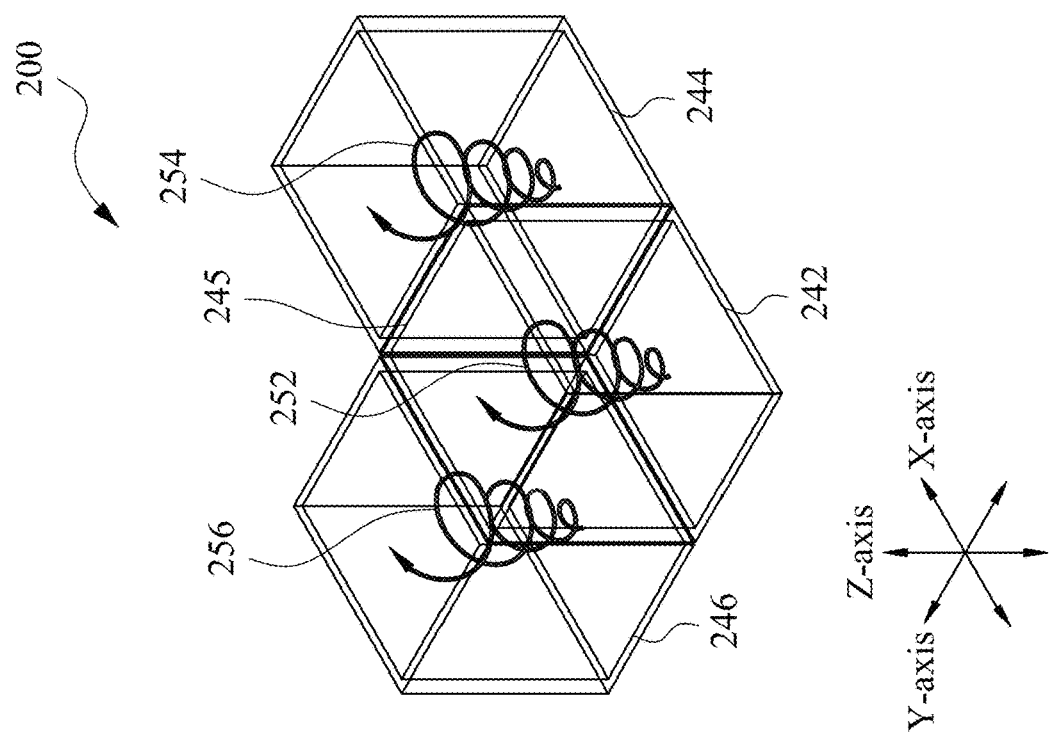

FIG. 2C is a schematic perspective view of a region of the IC device 200 as in FIG. 2B, in accordance with some embodiments. In FIG. 2C, ring regions 244, 246 correspondingly surrounding the tower structures 234, 236 are additionally schematically illustrated. The ring regions 244, 246 have similar configurations to the ring region 242. The ring regions 242, 244 share a common boundary region 245. In FIG. 2C, electrical charges accumulated during the manufacture of the tower structures 232, 234, 236 (not shown in FIG. 2C) are schematically illustrated correspondingly at 252, 254, 256. As can be seen in FIG. 2C, the accumulated electrical charges 252, 254, 256 are limited by the corresponding ring regions 242, 244, 246 to the individual tower structures 232, 234, 23. As a result, a large amount of electrical charges is prevented from being accumulated, and it is possible to satisfy antenna effect requirements for improved manufacturability.

FIG. 2D is a schematic perspective view of a tower structure 259 of an IC device, in accordance with some embodiments. Compared to the tower structures 232, 234, 236, 238 described with respect to FIG. 2A, the tower structure 259 additionally comprises conductive patterns in a metal layer Mk and vias in a via layer Vk-1. The tower structure 259 with the additional conductive patterns and vias in the metal layer Mk and via layer Vk-1 provides a stronger mechanical strength for an IC device including tower structures having the configuration of the tower structure 259. In FIG. 2D, the vias of the via layer Vk-2 physically and electrically coupled to a conductive pattern of the metal layer Mk-1 are shifted along the Y-axis from the vias of the via layer Vk-1 physically and electrically coupled to the same conductive pattern of the metal layer Mk-1. In at least one embodiment, the tower structures 232, 234, 236, 238 described with respect to FIG. 2A has a configuration of the tower structure 259 in FIG. 2D. The described tower structure configurations in FIGS. 2A-2D are examples. Other tower structure configurations, e.g., with different numbers of metal layers and/or different numbers of via layers and/or different numbers of conductive patterns in each metal layers and/or different numbers of vias in each via layer, are within the scopes of various embodiments.

Figures 3A, 3B:
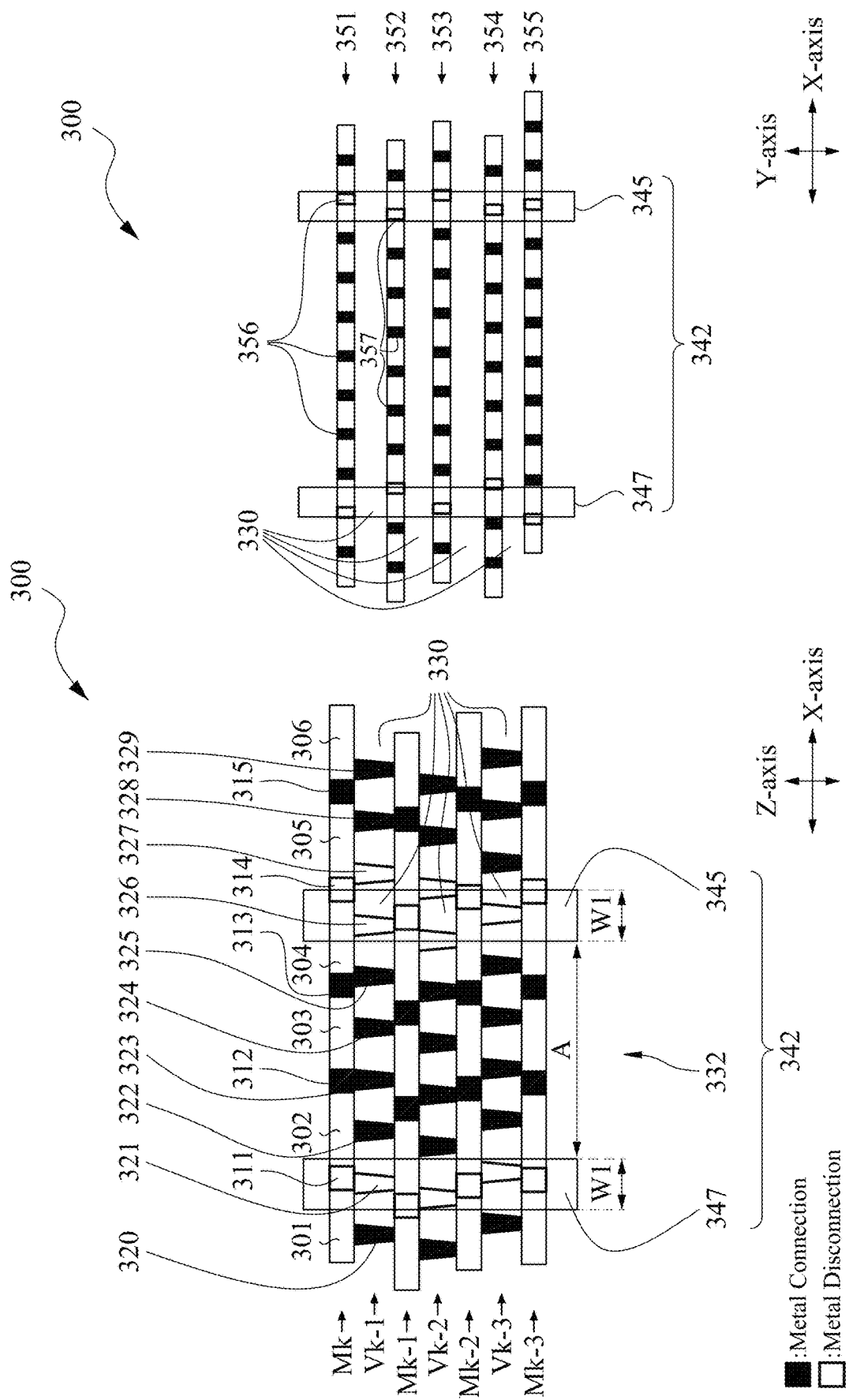
FIG. 3A is a schematic cross-sectional view of an IC device, in accordance with some embodiments.
FIG. 3B is a schematic plan view of a metal layer in an IC device, in accordance with some embodiments.

FIG. 3A is a schematic cross-sectional view of an IC device 300, in accordance with some embodiments. In at least one embodiment, the IC device 300 corresponds to one or more of the IC devices 100, 200.

The IC device 300 comprises an ILD 330, a tower structure 332, and a ring region 342. The tower structure 332 is embedded in the ILD 330 and is surrounded by the ring region 342. The ring region 342 comprises a portion of the ILD 330 that extends around the tower structure 332. Two boundary regions 345, 347 of the ring region 342 are illustrated in FIG. 3A. In some embodiments, the ILD 330, tower structure 332, ring region 342, and boundary regions 345, 347 correspond to the ILD 129, tower structure 232, ring region 242, and boundary regions 245, 247. The tower structure 332 comprises conductive patterns in metal layers Mk-3 to Mk, and vias in via layers Vk-3 to Vk-1.

In some embodiments, at the design stage, the tower structure 332 is generated by an Automated Placement and Routing (APR) tool or system. An example configuration of an APR system is described with respect to FIG. 9. The APR tool is configured to generate a seed conductive pattern placement (also referred to in some embodiments as "seed dummy metal placement") in a layout of the IC device 300 to be manufactured. For example, for the metal layer Mk, the seed dummy metal placement comprises a plurality of seed conductive patterns 301-306 elongated along the X-axis, and are spaced from each other. In some embodiments, the conductive patterns 301-306 have the same length or dimension along the X-axis, and are spaced from each other by equal spacings indicated at locations 311-315. Depending on one or more antenna effect requirements and/or mechanical strength requirements corresponding to specific configurations and/or manufacturing processes of the IC device 300 to be manufactured, a size of the tower structure 332 and/or a size of the ring region 342 are determined. For example, a width A of the tower structure 332 along the X-axis and/or a width w1 of the boundary regions 345, 347 along the X-axis are determined.

One or more of the locations 311-315 between the seed conductive patterns 301-306 fall in or overlap the boundary regions 345, 347 and are determined by the APR tool to be metal disconnections, whereas the other locations 311-315 between the seed conductive patterns 301-306 do not fall in or overlap the boundary regions 345, 347 and are determined by the APR tool to be metal connections. For example, locations 311 and 314 fall in or overlap the boundary regions 345, 347, and are determined as metal disconnections. In the manufactured IC device 300A, no conductive features are formed at the locations 311, 314 and the conductive patterns of the tower structure 332 are physically disconnected from corresponding conductive patterns of adjacent tower structures at the locations 311, 314. On the other hand, locations 312, 313, 315 do not fall in or overlap the boundary regions 345, 347, and are determined by the APR tool to be metal connections. In the manufactured IC device 300A, conductive features are formed at the locations 312, 313, 315, and a continuous conductive pattern is formed from the seed conductive pattern 302, metal connection 312, seed conductive pattern 303, metal connection 313, and seed conductive pattern 304. This conductive pattern terminates at the location 311, 314 corresponding to the boundary regions 345, 347.

A similar process is performed for the via layer Vk-1 where the APR tool is configured to generate a plurality of predetermined via locations 320-329. The APR tool is further configured to determine that the via locations 321, 326 fall in or overlap the boundary regions 345, 347, and are therefore VIA disconnections where no vias are to be formed in the actual IC device 300 to be manufactured. The APR tool is further configured to determine that the via locations 320, 322-325, 328-329 do not fall in or overlap the boundary regions 345, 347, and are therefore VIA connections where vias are to be formed in the actual IC device 300 to be manufactured. Although the via location 327 does not fall in or overlap the boundary regions 345, 347, the via location 327 corresponds to, i.e., overlaps along the Z-axis, the metal disconnection 314 where no conductive feature is to be formed. As a result, the APR tool is configured to determine that the via location 327 is also a via disconnection where a via is not to be formed in the actual IC device 300 to be manufactured. The processes described for the metal layer Mk and the via layer Vk-1 are performed correspondingly for the other metal layers and via layers of the tower structure 332. As a result, a layout of the tower structure 332 is generated as a part of a layout of the IC device 300. The IC device 300 including the tower structure 332 is manufactured based on the generated layout.

FIG. 3B is a schematic plan view of a metal layer of the IC device 300, in accordance with some embodiments. For example, the metal layer Mk-2 is schematically illustrated in FIG. 3B. The seed conductive patterns of the metal layer Mk-2 are arranged along a plurality of metal tracks 351-355. The example configuration in FIG. 3B is an example showing that, in one or more embodiments, seed conductive patterns along different metal tracks of the same metal layer are different from each other. For example, locations 356 for metal connections or disconnections along the metal track 351 are not aligned, along the Y-axis, with locations 357 for metal connections or disconnections along the metal track 352. Other configurations are within the scopes of various embodiments. For example, in some embodiments, locations for metal connections or disconnections along different metal tracks of the same metal layer are aligned with each other.

As described herein, the configurations or sizes of the tower structures and/or ring regions are determined based on various requirements, such as antenna effect requirements and/or mechanical strength requirements. For example, when the width A of a tower structure is increased, the area for accumulating electrical charges is increased, and the possibility of the antenna effect requirements being violated is increased. As the width A of the tower structure is decreased and/or the width w1 of the boundary regions 345, 347 is increased, the numbers of metal disconnections and/or via disconnections are increased, resulting in a reduced density of conductive patterns and vias in the bump receiving region of the IC device 300, and the possibility of the mechanical strength requirements being violated is increased. In at least one embodiment, by selecting appropriate sizes and/or configurations of tower structures and/or ring regions, it is possible to satisfy potentially conflicting antenna effect and mechanical strength requirements which, in turn, makes it possible to achieve one or more effects as described herein.

In some embodiments, the appropriate configurations of the tower structures and/or ring regions are achievable simply by determining metal disconnections and/or via disconnections, with minimal changes to the seed conductive pattern placement. In some embodiments, it is possible to keep the maximum cumulative area, where electrical charges are accumulated, at a low average value. In some embodiments, a reduced maximum peak connected area value is achievable. In some embodiments, it is possible to accurately control a maximum cumulative area in a worst case scenario. In some embodiments, it is possible to satisfy antenna effect requirements while achieving a high density of conductive patterns and vias in the bump receiving region of an IC device. In some embodiments, it is possible to achieve one or more advantages including, but not limited to, improved EOS protection, reduced leakage, improved yield, improved bumping success rate, minimal reduction in conductive pattern and/or via areas or density, or the like. In some embodiments, IC devices and/or processes described herein are applicable to various technology generations, and/or to other applications such as hard mask etch for other layers.

Figures 4A, 4B:
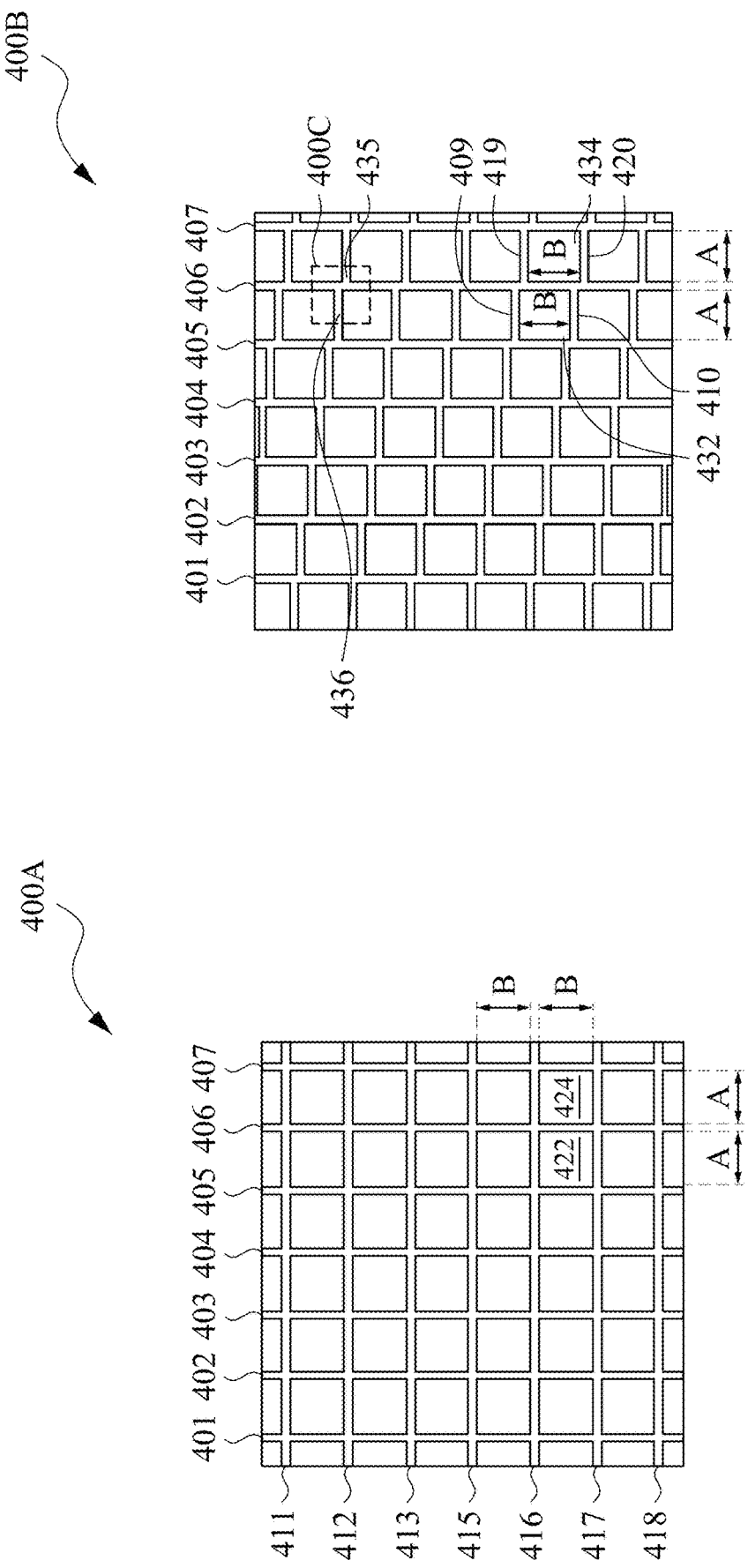
FIGS. 4A-4B are schematic plan views of various IC devices, in accordance with some embodiments.

FIG. 4A is a schematic plan view of an IC device 400A, in accordance with some embodiments. In some embodiments, the IC device 400A corresponds to one or more of the IC devices 100, 200, 300.

The IC device 400A comprises a plurality of ring regions which are continuous and connected with each other in a grid. The grid comprises a plurality of Y-axis boundary regions 401-407 extending along the Y-axis, and a plurality of X-axis boundary regions 411-418 extending along the X-axis. In at least one embodiment, each of the Y-axis boundary regions 401-407 corresponds to one or more of lines 215, 217, and/or each of the X-axis boundary regions 411-418 corresponds to one or more of lines 211, 213. A pair of adjacent Y-axis boundary regions and a pair of adjacent X-axis boundary regions intersect each other to from a ring region extending around a corresponding tower structure. For example, the pair of adjacent Y-axis boundary regions 405, 406, and the pair of adjacent X-axis boundary regions 416, 417 intersect each other to from a ring region extending around a corresponding tower structure 422. For another example, the pair of adjacent Y-axis boundary regions 406, 407, and the pair of adjacent X-axis boundary regions 416, 417 intersect each other to from a ring region extending around a corresponding tower structure 424. In at least one embodiment, the tower structures 422, 424 correspond to the tower structures 232, 234. Each ring region has a dimension A along the X-axis, e.g., as described with respect to FIG. 3A, and a dimension B along the Y-axis. In some embodiments, dimensions A and B are the same. In at least one embodiment, dimensions A and B are different. In at least one embodiment, one or more advantages described herein are achievable by the IC device 400A.

FIG. 4B is a schematic plan view of an IC device 400B, in accordance with some embodiments. In some embodiments, the IC device 400B corresponds to one or more of the IC devices 100, 200, 300.

The IC device 400B comprises a plurality of ring regions which are continuous and connected with each other in a lattice pattern. The lattice pattern comprises the Y-axis boundary regions 401-407 extending along the Y-axis. Ring regions adjacent each other along the X-axis share boundary regions defined by the Y-axis boundary regions 401-407.

Along the X-axis, however, the boundary regions of the adjacent ring regions are not aligned which is different from the configuration in FIG. 4A. For example, the ring regions surrounding tower structures 432, 434 share a boundary region along the Y-axis boundary region 406, have boundary regions 409, 419 which are not aligned along the X-axis, and have further boundary regions 410, 420 which are not aligned along the X-axis. In at least one embodiment, the tower structures 432, 434 correspond to the tower structures 232, 234. Each ring region has a dimension A along the X-axis, e.g., as described with respect to FIG. 3A, and a dimension B along the Y-axis. In some embodiments, dimensions A and B are the same. In at least one embodiment, dimensions A and B are different. In at least one embodiment, one or more advantages described herein are achievable by the IC device 400B.

Figure 4C:
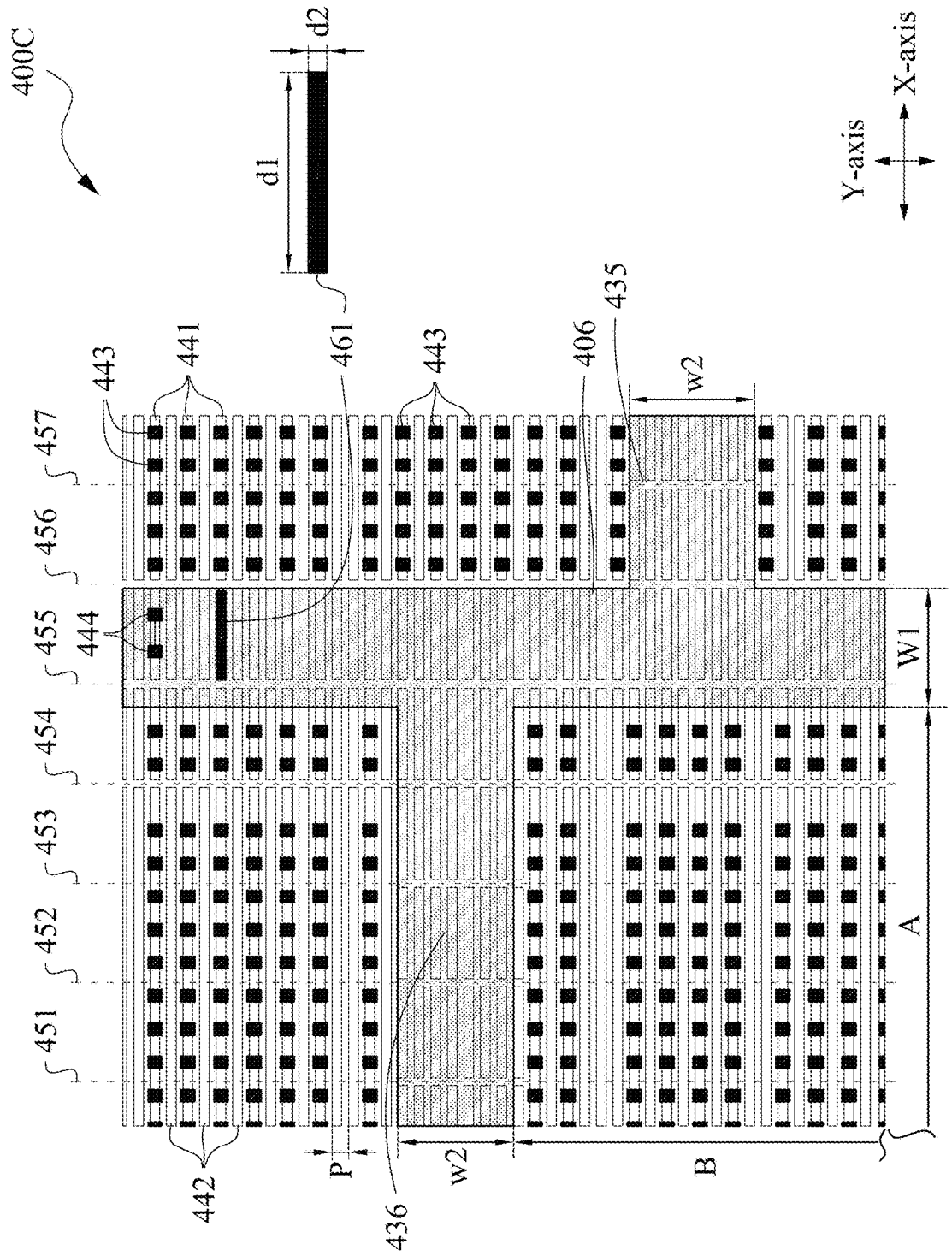
FIG. 4C is an enlarged schematic view of a region of the IC device in FIG. 4B.

FIG. 4C is an enlarged schematic view of a region 400C of the IC device 400B in FIG. 4B. In some embodiments, the configuration of the region 400C is applicable to the IC device 400A.

In the example configuration in FIG. 4C, conductive patterns of a metal layer, e.g., the metal layer Mk, and vias of a via layer, e.g., the via layer Vk-1 are illustrated. The metal layer Mk comprises a plurality of conductive patterns 441 and a plurality of conductive patterns 442 arranged alternatingly along the Y-axis. The conductive patterns 441, 442 are elongated along the X-axis. The conductive patterns 441 are electrically coupled to corresponding vias of the via layer Vk-1. The vias of the via layer Vk-1 are arranged at one or more via pitches as described with respect to FIG. 2A. Several vias of the via layer Vk-1 are indicated as 443. The conductive patterns 442 are not electrically coupled to the vias of the via layer Vk-1. A conductive pattern 441 and an adjacent conductive pattern 442 are arranged along the Y-axis at a metal pitch p which, in at least one embodiment, corresponds to one or more of the metal pitches described with respect to FIG. 2A. The described configuration of conductive patterns in the metal layer Mk is an example. Other configurations are within the scopes of various embodiments.

The region 400C in FIG. 4C further comprises boundary regions 406, 435, 436 of corresponding ring regions. The description herein with respect to the boundary regions 406, 435, 436 is applicable to the ring regions. The boundary regions 406, 435, 436 comprise therein a plurality of Mk conductive patterns of the metal layer Mk, and a plurality of Vk-1 vias over and electrically coupled to the corresponding Mk conductive patterns. A representative Mk conductive pattern 461 in the boundary regions 406, 435, 436 is shown in an enlarged scale. The Mk conductive pattern 461 in the ring region is aligned with an Mk conductive pattern 441 in a tower structure, and is physically disconnected from the Mk conductive pattern 441 by a spacing along a line 456. The Mk conductive patterns in the boundary regions 406, 435, 436 are physically disconnected at locations along lines 451-457. In at least one embodiment, in the boundary regions 406, 435, 436, the lines 451-457 correspond to the locations 311, 314 for metal disconnections, but outside the boundary regions 406, 435, 436, the lines 451-457 correspond to the locations 312, 313, 315 for metal connections, as described with respect to FIG. 3A. The Mk conductive patterns, e.g., 441, 442, are continuous at the lines 451-457 outside the boundary regions 406, 435, 436. The Mk conductive patterns in the boundary regions 406, 435, 436 are physically disconnected from the Mk conductive patterns outside the boundary regions 406, 435, 436, as shown along lines 455, 456 in FIG. 4C.

The Vk-1 vias are arranged over the boundary regions 406, 435, 436 at one or more via pitches as Vk-1 vias 443, except where via disconnections are indicated, as described with respect to FIG. 3A. Several representative Vk-1 vias in the boundary regions 406, 435, 436 are illustrated and indicated at 444. Other Vk-1 vias in the boundary regions 406, 435, 436 are omitted for simplicity. In at least one embodiment, the Mk conductive patterns, such as 461, in the boundary regions 406, 435, 436 are floating conductive patterns. In some embodiments, the boundary regions 406, 435, 436 further comprise floating conductive patterns and vias in other metal layers and via layers. The floating conductive patterns and vias in various metal layers and via layers in the boundary regions 406, 435, 436 are over and electrically coupled to each other in a manner similar to the tower structures as described herein.

The boundary region 406 elongated along the Y-axis has a width w1 along the X-axis. The boundary regions 435, 436 elongated along the X-axis have a width w2 along the Y-axis. In some embodiments, the widths w1 and w2 are the same. In one or more embodiments, the widths w1 and w2 are different. Each of the Mk conductive pattern 461 in the boundary regions 406, 435, 436 has a length, or longer dimension, d1 along the X-axis, and a width, or shorter dimension, d2 along the Y-axis. For a different metal layer, e.g., the metal layer Mk-1, conductive patterns have a longer dimension along the Y-axis, and a shorter dimension along the X-axis. In some embodiments, the dimensions d1, D2 are those of one seed conductive pattern, as described with respect to FIG. 3A.

In some embodiments, a perimeter of each conductive pattern in a ring region is from 1.5 to 5 times a width of the ring region. For example, the perimeter of the Mk conductive pattern 461 in the ring region is 2×(d1+d2) and is from 1.5 to 5 times the width w1 or w2 of the ring region. When the perimeter of each conductive pattern in the ring region is less than 1.5 times the width of the ring region, then the density of conductive patterns and/or vias in a bump receiving region of the IC device containing the ring region will be reduced to an extent that mechanical strength requirements for the IC device will be potentially violated. When the perimeter of each conductive pattern in the ring region is greater than 5 times the width of the ring region, then there will be an increased likelihood that one or more conductive patterns in the ring region extend beyond the ring region and electrically connect the tower structure surrounded by the ring region with one or more other tower structures not surrounded by the ring region. When this happens, multiple tower structures are electrically connected with each other. As a result, an cumulative area, where electrical charges are accumulated during manufacture of the IC device, will be increased to an extent that antenna effect requirements for the IC device will be potentially violated.

In some embodiments, the width of the ring region is not less than a longest dimension of each conductive pattern in the ring region. For example, the width w1 or w2 of the ring region is not less than the longest dimension d1 of the Mk conductive pattern 461. When the width of the ring region is less than the longest dimension of each conductive pattern in the ring region, then there will be an increased likelihood that one or more conductive patterns in the ring region extend beyond the ring region and electrically connect the tower structure surrounded by the ring region with one or more other tower structures not surrounded by the ring region, which will increase the cumulative area for electrical charges to an extent that the antenna effect requirements for the IC device will be potentially violated.

In some embodiments, a width of a tower structure surrounded by a ring region is from 500 to 1500 times the metal pitch. For example, the width A or B of a tower structure is from 500 to 1500 times the metal pitch p. When a width of a tower structure surrounded by a ring region is less than 500 times the metal pitch, then the density of conductive patterns and/or vias in the bump receiving region of the IC device containing the ring region will be reduced to an extent that the mechanical strength requirements for the IC device will be potentially violated. When a width of a tower structure surrounded by a ring region is greater than 1500 times the metal pitch, then the cumulative area for electrical charges in the tower structure itself will be increased to an extent that the antenna effect requirements for the IC device will be potentially violated.

In some embodiments, a width of a ring region is from 15 to 150 times the metal pitch. For example, the width w1 or w2 of the ring region is from 15 to 150 times the metal pitch p. When a width of a ring region is less than 15 times the metal pitch, then there will be an increased likelihood that one or more conductive patterns in the ring region extend beyond the ring region and electrically connect the tower structure surrounded by the ring region with one or more other tower structures not surrounded by the ring region, which will increase the cumulative area for electrical charges to an extent that the antenna effect requirements for the IC device will be potentially violated. When a width of a ring region is greater than 150 times the metal pitch, then the density of conductive patterns and/or vias in the bump receiving region of the IC device containing the ring region will be reduced to an extent that the mechanical strength requirements for the IC device will be potentially violated. In at least one embodiment, one or more advantages described herein are achievable by an IC device including tower structures and/or ring regions having the configurations described with respect to FIG. 4C.

Figure 5B:
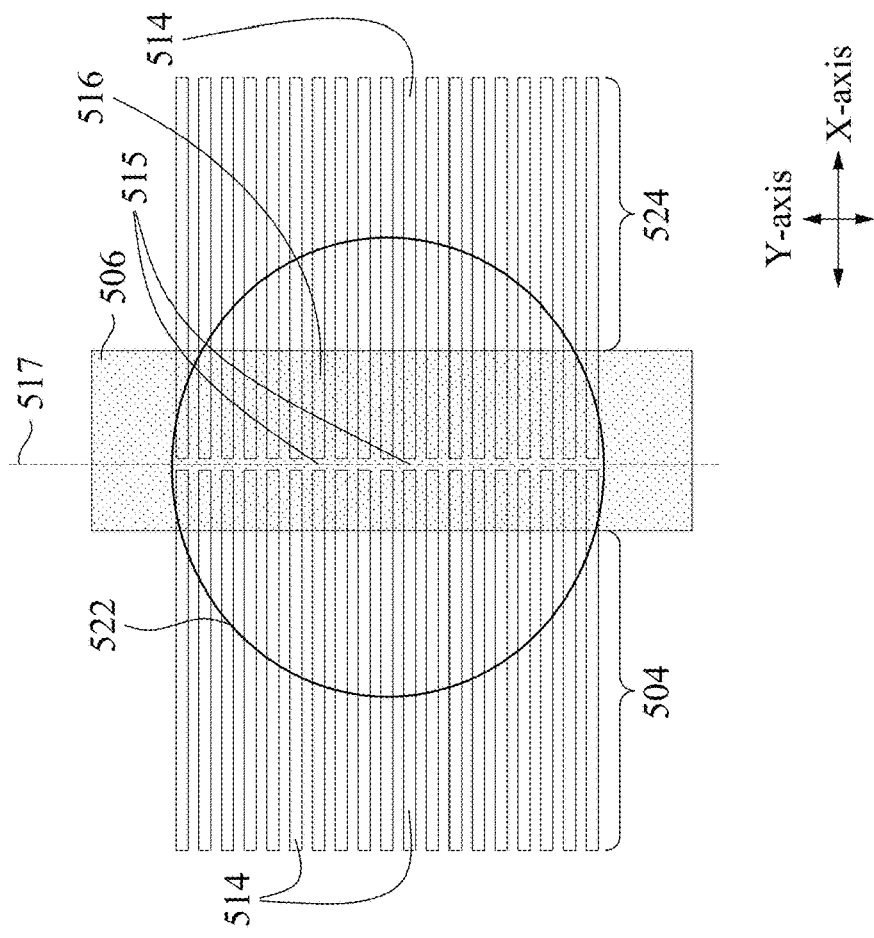
FIGS. 5A-5C are schematic plan views of various bumping areas in one or more IC devices, in accordance with some embodiments.
Figure 5A:
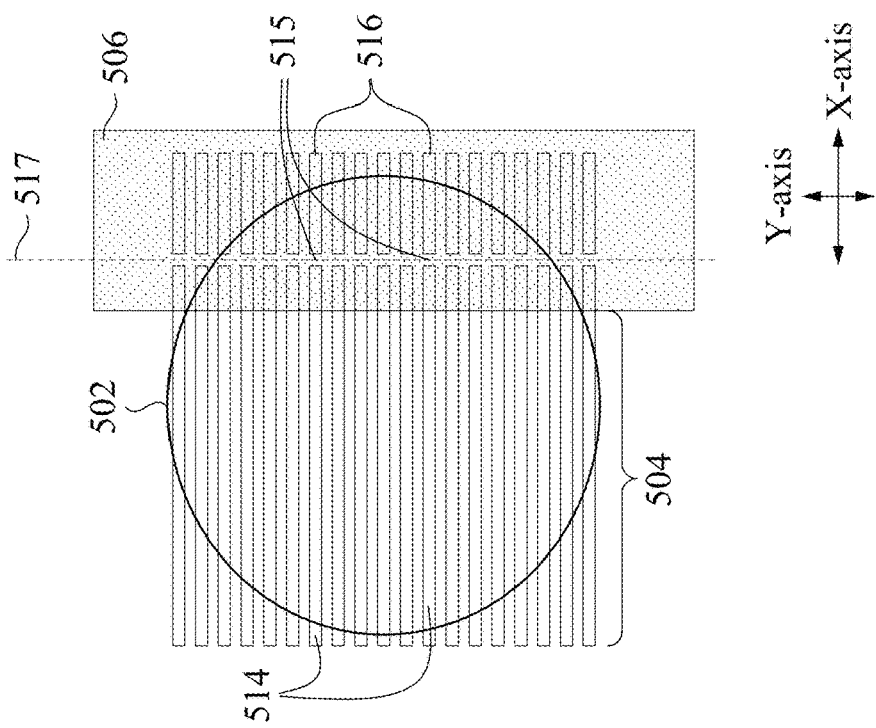
Figure 5C:
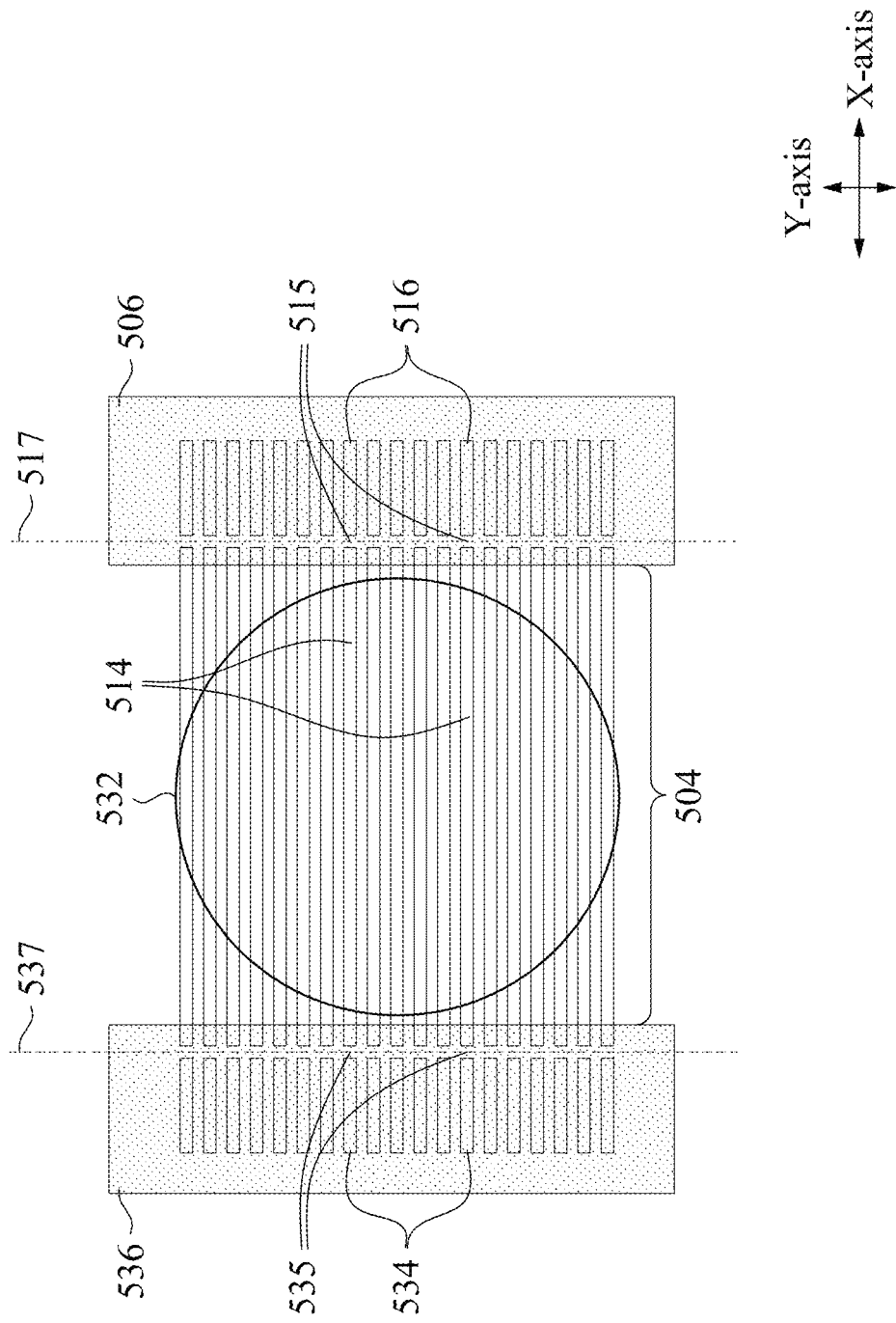

FIGS. 5A-5C are schematic plan views of various bumping areas of UBM structures in one or more IC devices, in accordance with some embodiments. In at least one embodiment, the one or more IC devices correspond to one or more of the IC devices 100, 200, 300, 400A, 400B, and/or one or more of the UBM structures correspond to the UBM structure 160. In at least one embodiment, one or more bumping areas described with respect to FIGS. 5A-5C correspond to the bumping area 162 described with respect to FIG. 1B.

In FIG. 5A, a bumping area 502 overlaps, along the thickness direction, a tower structure 504, and a corresponding ring region 506 surrounding the tower structure 504, as described herein. For simplicity, the tower structure 504 and the ring region 506 are partially illustrated in FIG. 5A. The tower structure 504 and the ring region 506 include corresponding conductive patterns 514, 516 of a metal layer. The corresponding conductive patterns 514, 516 are aligned with each other, e.g., along the X-axis, and are physically disconnected from each other by a spacing 515 corresponding to a line 517. In some embodiments, the line 517 corresponds to a location for metal disconnection, as described herein. The bumping area 502 overlaps the spacing 515 along the thickness direction.

In FIG. 5B, a bumping area 522 overlaps, along the thickness direction, the tower structure 504, the corresponding ring region 506 surrounding the tower structure 504, and an adjacent tower structure 524, as described herein. For simplicity, the tower structures 504, 524 and the ring region 506 are partially illustrated in FIG. 5B. The tower structure 504 and the ring region 506 include corresponding conductive patterns 514 and 516 of a metal layer. The conductive pattern 516 extends further into the tower structure 524. The corresponding conductive patterns 514, 516 are aligned with each other, e.g., along the X-axis, and are physically disconnected from each other by the spacing 515 corresponding to the line 517. In some embodiments, the line 517 corresponds to a location for metal disconnection, as described herein. The bumping area 522 overlaps the spacing 515 along the thickness direction.

In FIG. 5C, a bumping area 532 overlaps, along the thickness direction, the tower structure 504, without overlapping the corresponding ring region surrounding the tower structure 504. The ring region surrounding the tower structure 504 comprises boundary regions 506, 536 between which the tower structure 504 is located. For simplicity, the tower structure 504 and the ring region are partially illustrated in FIG. 5C. The tower structure 504 and the boundary regions 506, 536 include corresponding conductive patterns 514, 516, 534 of a metal layer. The corresponding conductive patterns 514, 516 are aligned with each other, e.g., along the X-axis, and are physically disconnected from each other by a spacing 515 corresponding to a line 517. The corresponding conductive patterns 514, 534 are aligned with each other, e.g., along the X-axis, and are physically disconnected from each other by a spacing 535 corresponding to a line 537. In some embodiments, the lines 517, 537 corresponds to locations for metal disconnection, as described herein.

In each of the example configurations in FIGS. 5A-5C, a total area of conductive patterns overlapped by the bumping area 502, 522 or 532 of the UBM structure in the thickness direction is from 0.5 to 0.9 times the bumping area 502, 522 or 532. The total area of conductive patterns overlapped by the bumping area includes all conductive patterns under the bumping area, including conductive patterns 514 in one or more tower structures and conductive patterns 516, 534 in one or more ring regions. When the total area of conductive patterns overlapped by the bumping area of the UBM structure in the thickness direction is less than 0.5 times the bumping area, then the density of conductive patterns under the bumping area will be reduced to an extent that mechanical strength requirements for the IC device will be potentially violated. When the total area of conductive patterns overlapped by the bumping area of the UBM structure in the thickness direction is greater than 0.9 times the bumping area, one or more metal space constraints will be potentially violated. In at least one embodiment, one or more advantages described herein are achievable by one or more IC devices including the configurations described with respect to FIGS. 5A-5C.

Figure 6:
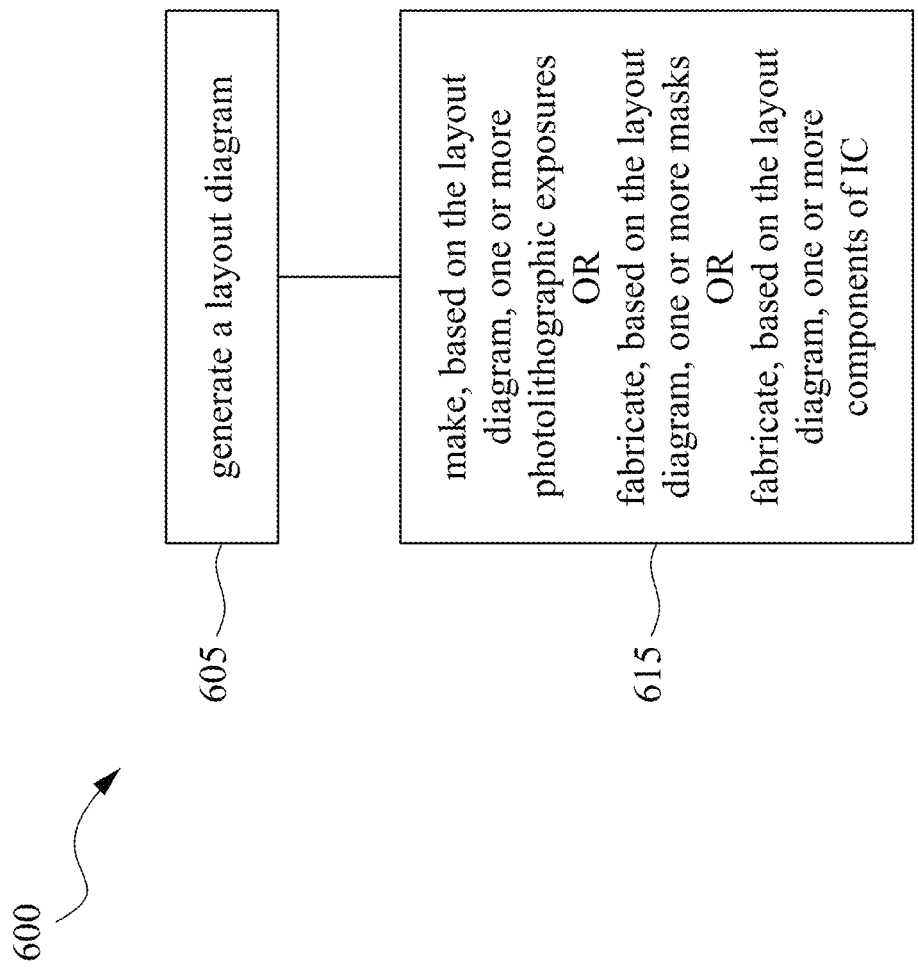
FIGS. 6-7 are flowcharts of various methods, in accordance with some embodiments.

FIG. 6 is a flowchart of a method 600 of generating a layout diagram and using the layout diagram to manufacture an IC device, in accordance with some embodiments.

Method 600 is implementable, for example, using an electronic design automation (EDA) system 900 (FIG. 9, discussed below) and an integrated circuit (IC) manufacturing system 1000 (FIG. 10, discussed below), in accordance with some embodiments. Examples of an IC device to be manufactured according to method 600 include IC devices described with respect to one or more of FIGS. 1A-5C. In FIG. 6, method 600 includes operations 605, 615.

At operation 605, a layout diagram is generated which, among other things, include patterns represent one or more circuit regions, circuitry, circuits, cells, RDL structures as described herein. Examples of an IC device corresponding to a layout diagram generated by operation 605 include IC devices described with respect to one or more of FIGS.

1A-5C. Operation 605 is discussed in more detail below with respect to FIG. 7. From operation 605, flow proceeds to operation 615.

At operation 615, based on the layout diagram, at least one of (A) one or more photolithographic exposures are made or (B) one or more semiconductor masks are fabricated or (C) one or more components in a layer of an IC device are fabricated. An example of operation 615 is described with respect to FIG. 8A.

Figure 7:
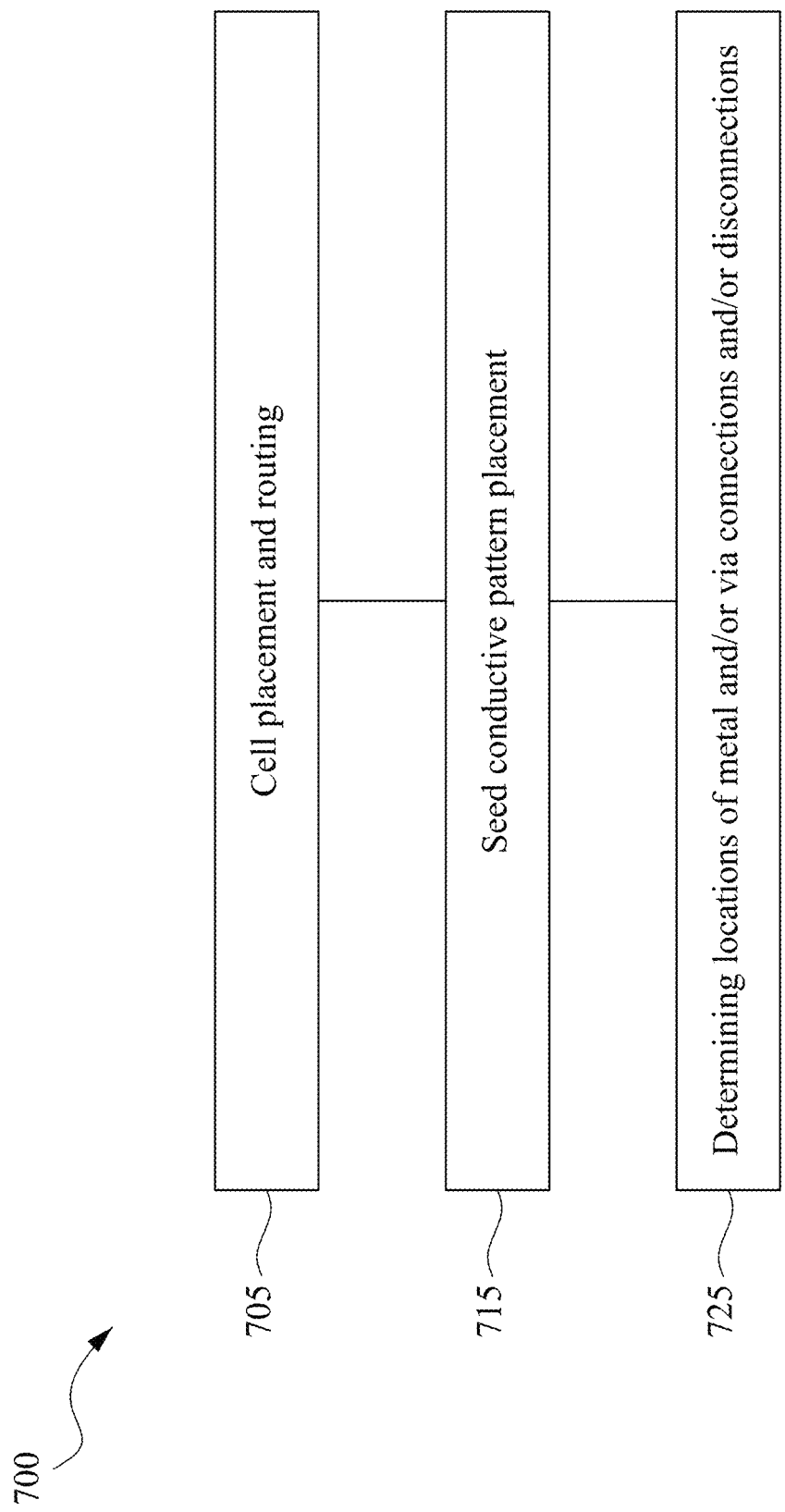

FIG. 7 is a flowchart of a method 700 of generating a layout diagram, in accordance with some embodiments. More particularly, the flowchart of FIG. 7 shows additional operations that demonstrates one example of procedures implementable in operation 605 of FIG. 6, in accordance with one or more embodiments. In at least one embodiment, method 700 is performed by an APR tool. In FIG. 7, method 700 includes operations 705, 715, 725.

At operation 705, cell placement and routing are performed. For example, in a cell placement operation, one or more cells are generated, or retrieved from one or more cell libraries, and placed in a layout of an IC device in accordance with a design of the functional circuitry of the IC device. Example cells include, but are not limited to, AND, OR, NAND, NOR, XOR, INV, OR-AND-Invert (OAI), MUX, Flip-flop, BUFF, Latch, delay, clock, memory, or the like. A routing operation is next performed to generate conductive patterns and/or vias to electrically couple the placed cells to form the functional circuitry of the IC device. The routing operation further comprises generating electrical connections to electrically couple the IC device to other, external devices.

At operation 715, as part of the routing operation for generating electrical connections to other, external devices, a seed conductive pattern placement is performed in a bump receiving region of the IC device. For example, a plurality of seed conductive patterns is intermittently placed in each metal layer of the bump receiving region, as described with respect to FIGS. 3A-3B.

At operation 725, depending on configurations of tower structures and/or ring regions in the bump receiving region, metal connections or metal disconnections are determined and generated between adjacent seed conductive patterns, as described with respect to FIGS. 3A-3B. Similarly, via connections or via disconnections are determined and generated, and included in the layout of the IC device. In at least one embodiment, the generated layout diagram of the IC device is stored on a non-transitory computer-readable medium.

Figure 8A:
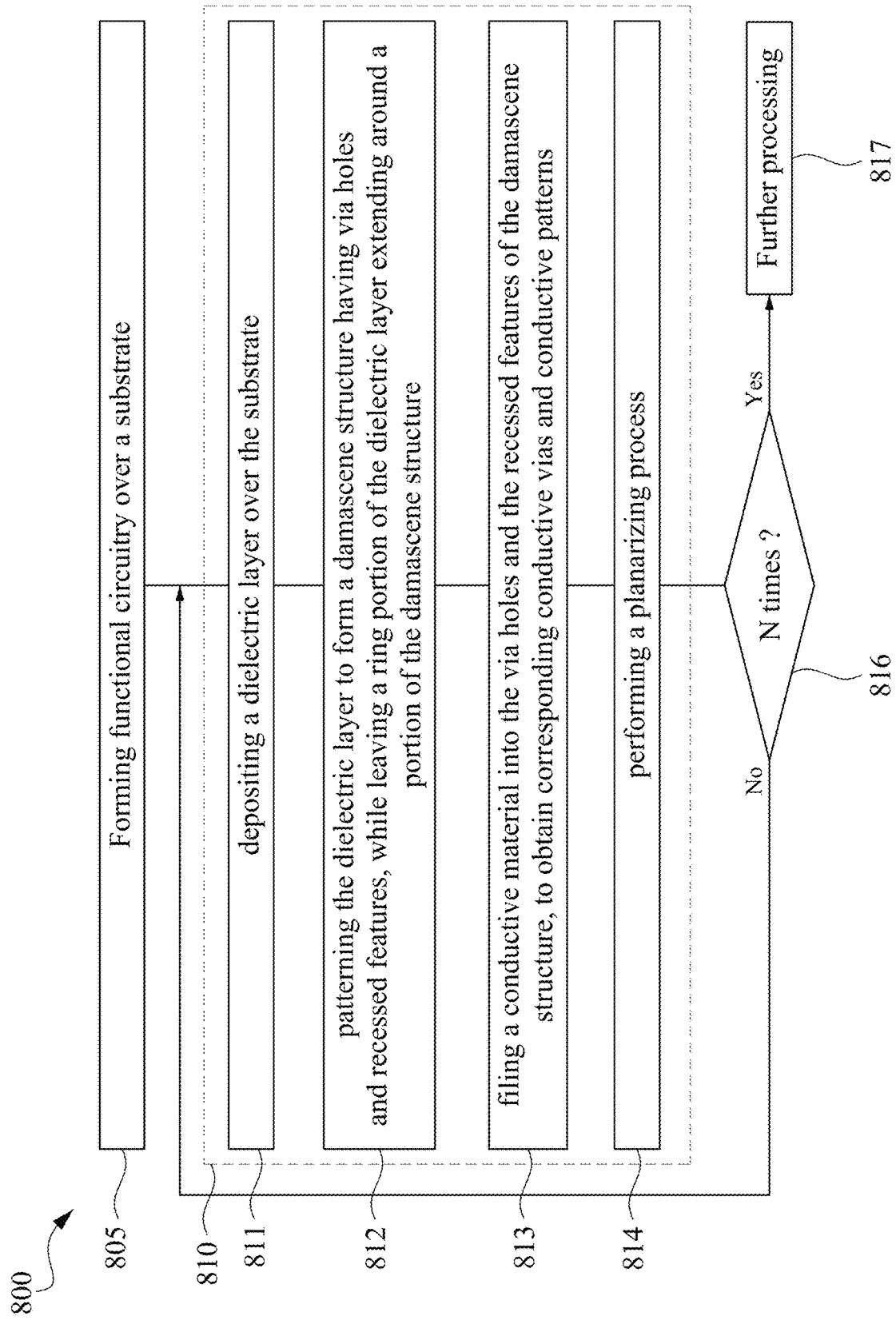
FIG. 8A is a flowchart of a manufacturing method, in accordance with some embodiments.

FIG. 8A is a flowchart of a method 800 of fabricating one or more components of an IC device, based on the layout diagram, in accordance with some embodiments. More particularly, the flowchart of FIG. 8A shows additional operations that demonstrates one example of procedures implementable in operation 615 of FIG. 6, in accordance with one or more embodiments. In FIG. 8A, method 800 includes operations 805, and 810-817. FIGS. 8B-8F are schematic cross-sectional views of an IC device at various stages in a manufacturing process corresponding to the method 800, in accordance with some embodiments. In some embodiments, the manufacturing process and/or modifications thereof are usable to manufacture one or more IC devices described with respect to FIGS. 1A-5C.

At operation 805, functional circuitry of an IC device is formed over a substrate. For example, gate electrodes and source/drain regions are formed over a substrate to configure a plurality of transistors. FIG. 8B is a schematic cross-sectional view of an IC device 820 at a manufacturing stage corresponding to operation 805. Corresponding elements of FIGS. 1B and 8B are designated by the same reference numerals.

An example manufacturing process starts from a substrate, such as the substrate 110 described with respect to FIG. 1B. The substrate comprises, in at least one embodiment, silicon, silicon germanium (SiGe), gallium arsenic, or other suitable semiconductor materials. Active regions are formed in or over the substrate, using one or more masks corresponding to one or more active regions in the layout diagrams described herein. A gate dielectric material layer is deposited over the substrate. Example materials of the gate dielectric material layer include, but are not limited to, a high-k dielectric layer, an interfacial layer, and/or combinations thereof. In some embodiments, the gate dielectric material layer is deposited over the substrate by atomic layer deposition (ALD) or other suitable techniques. A gate electrode layer is deposited over the gate dielectric material layer. Example materials of the gate electrode layer include, but are not limited to, polysilicon, metal, Al, AlTi, Ti, TiN, TaN, Ta, TaC, TaSiN, W, WN, MoN, and/or other suitable conductive materials. In some embodiments, the gate electrode layer is deposited by chemical vapor deposition (CVD), physical vapor deposition (PVD or sputtering), plating, atomic layer deposition (ALD), and/or other suitable processes. A patterning process is then performed, using one or more masks corresponding to one or more gate electrodes in the layout diagrams described herein. As a result, the gate dielectric material layer is patterned in to one or more gate dielectric layers, such as the gate dielectric layer 114, and the gate electrode layer is patterned into one or more gate electrodes, such as the gate electrode 115 described with respect to FIG. 1B. In at least one embodiment, spacers, such as spacers 116 described with respect to FIG. 1B, are formed, by deposition and patterning, on opposite sides of each gate electrode 115. Example materials of the spacers include, but are not limited to, silicon nitride, oxynitride, silicon carbide and other suitable materials. Example deposition processes include, but are not limited to, plasma enhanced chemical vapor deposition (PECVD), low-pressure chemical vapor deposition (LPCVD), sub-atmospheric chemical vapor deposition (SACVD), atomic layer deposition (ALD), or the like. Example patterning processes include, but are not limited to, a wet etch process, a dry etch process, or combinations thereof. Drain/source regions, such as the drain/source regions 112, 113 described with respect to FIG. 1B, are formed in the active regions of the substrate. In at least one embodiment, the drain/source regions are formed by using the gate electrodes and the spacers as a mask. For example, the formation of the drain/source regions is performed by an ion implantation or a diffusion process. Depending on the type of the devices or transistors, the drain/source regions are doped with p-type dopants, such as boron or $BF_2$, n-type dopants, such as phosphorus or arsenic, and/or combinations thereof.

Contact structures, via structures and one or more metal layers are subsequently formed to electrically couple the transistors into functional circuitry of the IC device. In an example manufacturing process, a conductive layer, e.g., a metal, is deposited over the substrate with the transistors formed thereon, thereby making electrical connections to the drain/source regions of the transistors. A planarizing process is performed to planarize the conductive layer, resulting in contact structures, such as the MD contact structure 117 described with respect to FIG. 1B, in electrical contact with the underlying drain/source regions. The planarizing process comprises, for example, a chemical mechanical polish (CMP) process. A dielectric layer is deposited over the substrate with the drain/source contacts formed thereon. The dielectric layer is etched, and the etched portions are filled with a conductive material, such as a metal, to form one or more via structures, such as the VD and VG vias 118, 119 described with respect to FIG. 1B. A planarizing process is performed. An M0 layer including a conductive material, such as a metal, is deposited over the planarized structure and patterned to form various M0 conductive patterns, such as the M0 conductive patterns 121, 122 described with respect to FIG. 1B. A dielectric layer is deposited over the patterned M0 layer. The dielectric layer is etched, and the etched portions are filled with a conductive material, such as a metal, to form one or more via structures in a V0 layer. For example, the V0 layer comprises the via 123 described with respect to FIG. 1B. A planarizing process is then performed. Further metal layers and via layers are sequentially formed over the V0 layer to form an interconnect structure.

As part of the process of forming an interconnect structure, such as the interconnect structure 120 described with respect to FIG. 1B, an interconnect formation process at operation 810 is repeatedly performed. The interconnect formation process comprises operations 811-814.

Operation 811 comprises depositing a dielectric layer over the substrate. For example, as shown in FIG. 8B, a dielectric layer 830 is deposited over the substrate 110 after the transistors are formed and at least partially coupled into the functional circuitry of the IC device 820 by lower metal layers and/or via layers, as described with respect to operation 805. In at least one embodiment, the dielectric layer 830 corresponds to one of the dielectric layers in the ILD 129 described with respect to FIG. 1B.

Operation 812 comprises patterning the dielectric layer to form a damascene structure having via holes and recessed features, while leaving a ring portion of the dielectric layer extending around a portion of the damascene structure. For example, as show in FIG. 8C, the dielectric layer 830 is patterned to form a damascene structure 831 having via holes 832, 834, 836 and recessed features 833, 835, 837 over the via holes 832, 834, 836. The via holes 832, 834, 836 correspond to conductive vias to be formed later, and the recessed features 833, 835, 837 correspond to conductive patterns to be formed latter. An example patterning process to form the damascene structure 831 comprises two or more photolithographic patterning and anisotropic etching steps to first form the via holes 832, 834, 836, then form the overlying recessed features 833, 835, 837. Un-etched parts of the dielectric layer 830 comprise ring portions 842, 844. The ring portions 842, 844 share a common boundary region 845. The ring portion 842 of the dielectric layer 830 extends around the recessed feature 833 and the via hole 832. The ring portion 844 of the dielectric layer 830 extends around the recessed feature 835 and the via hole 834.

Figure 8C:
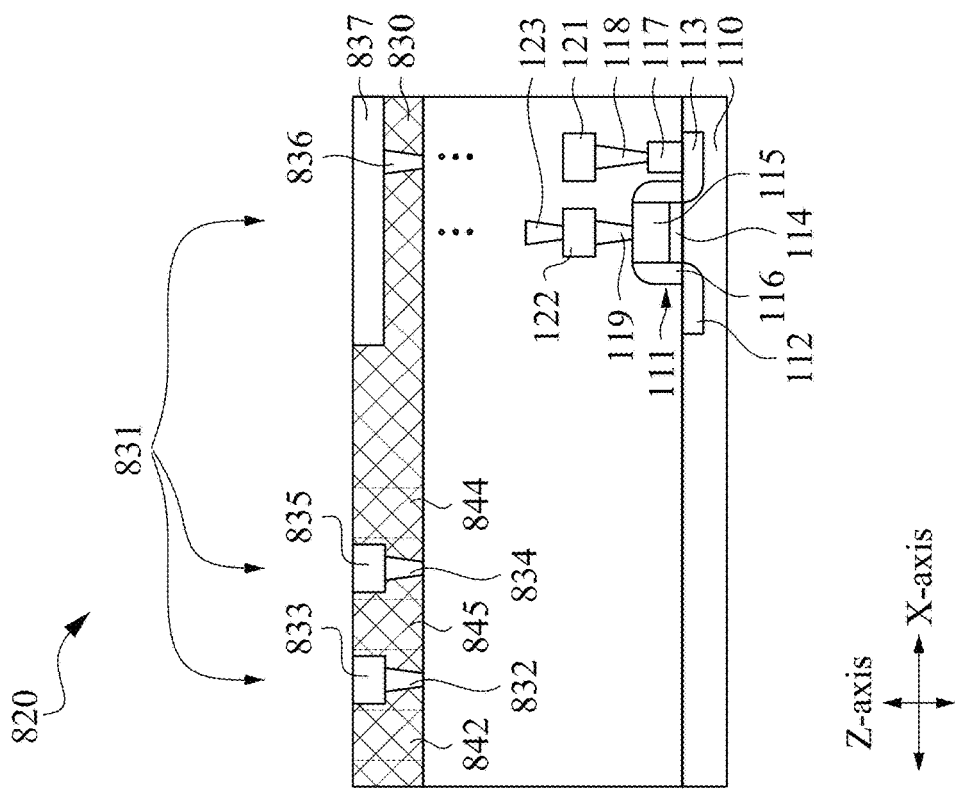
FIGS. 8B-8F are schematic cross-sectional views of an IC device at various stages in a manufacturing process, in accordance with some embodiments.
Figure 8B:
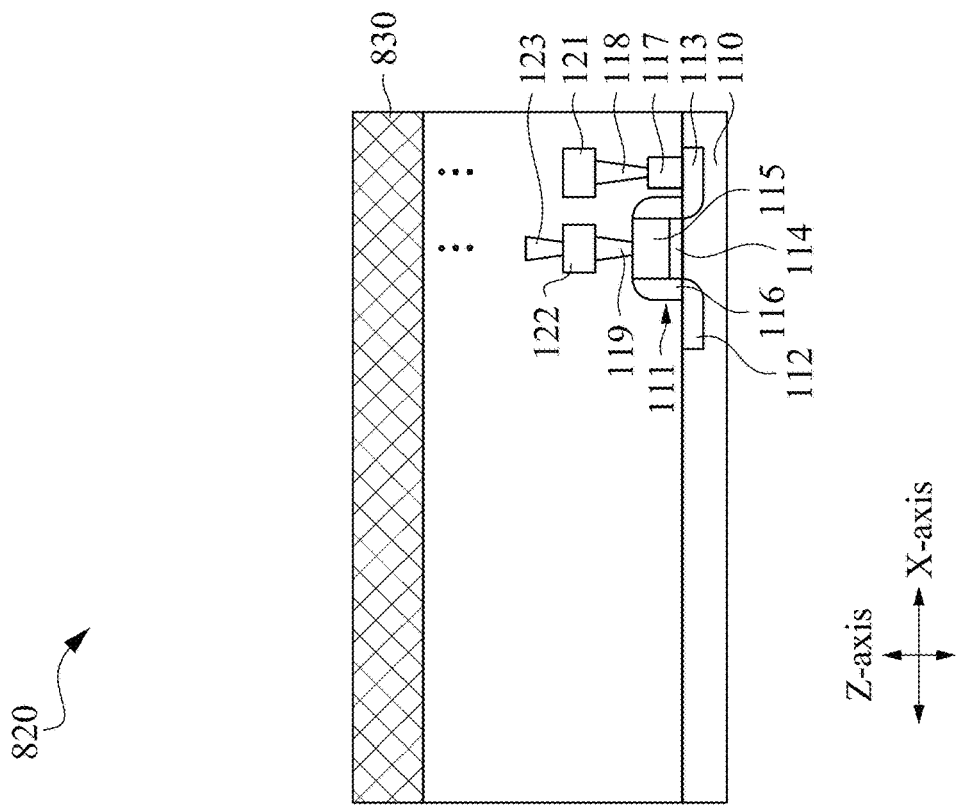
Figures 8D, 8E:
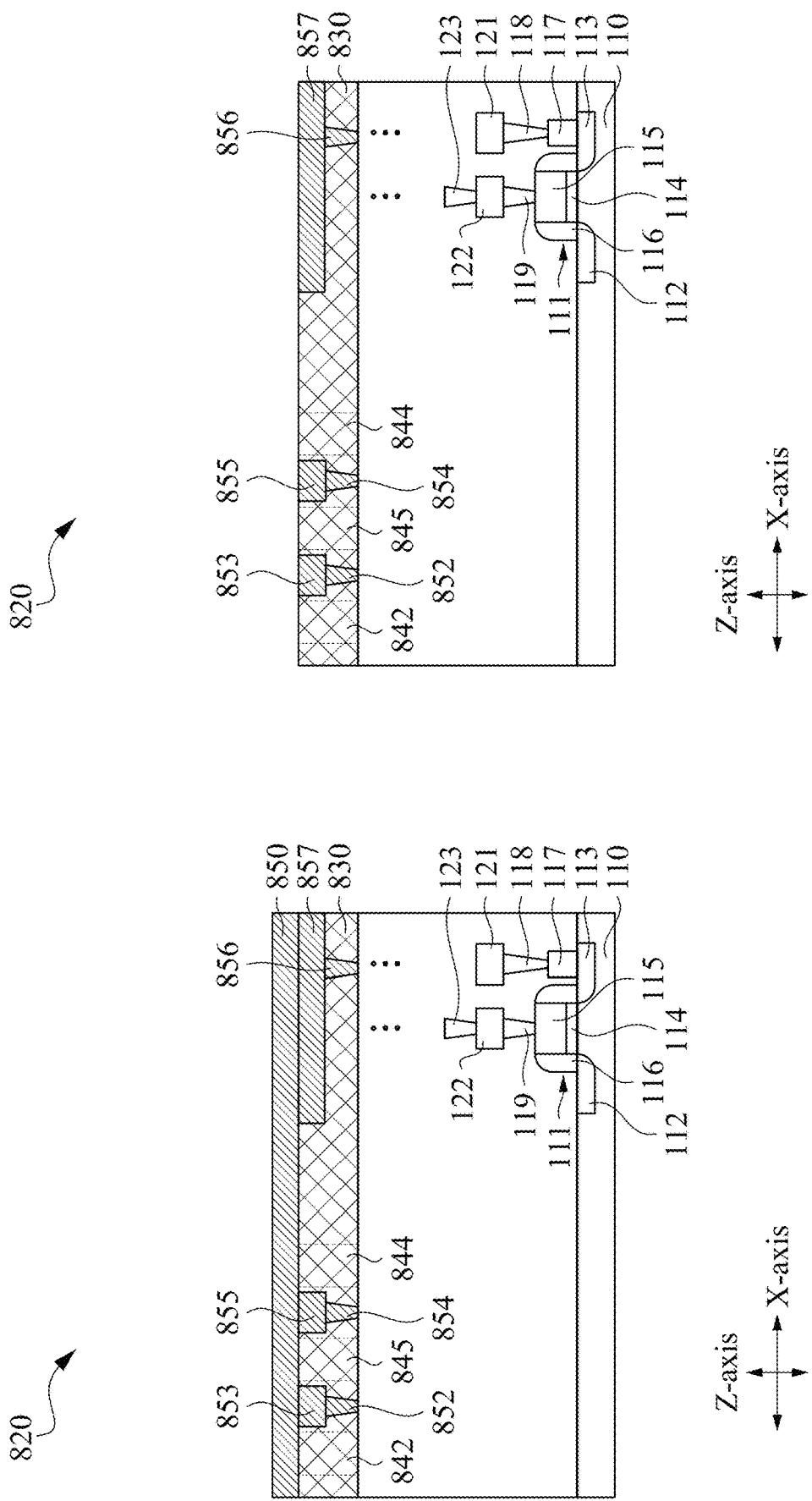
Figure 8F:
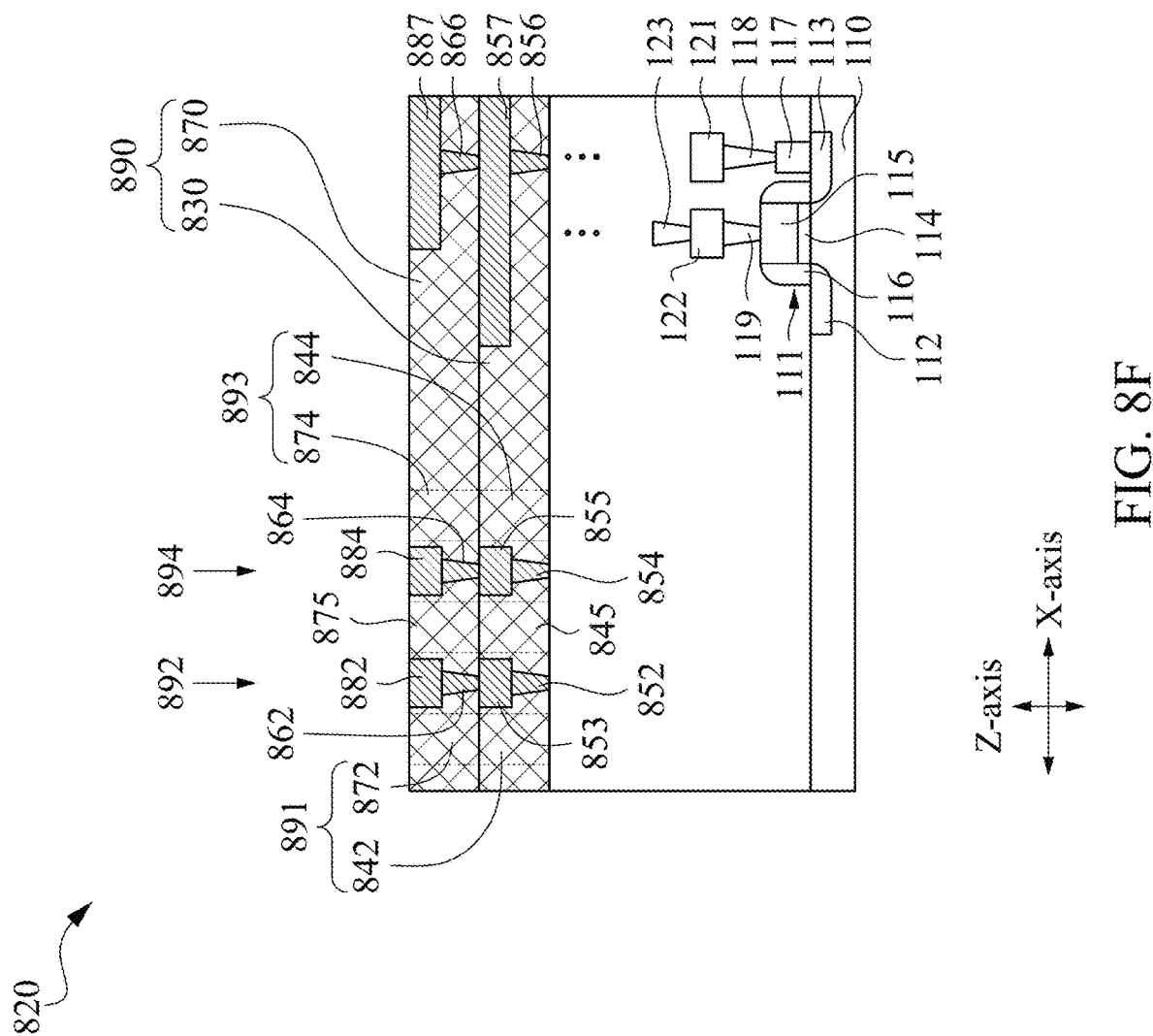

In the example configuration in FIG. 8C, the via hole 836 is over and exposes a underlying conductive pattern (not shown) which is electrically coupled to the functional circuitry of the IC device 820. As a result, a conductive via later formed in the via hole 836 and further conductive patterns and conductive vias subsequently formed over such conductive via will be electrically coupled to the functional circuitry of the IC device 820. In at least one embodiment, the via holes 832, 834 are over and expose a underlying dielectric layer. As a result, conductive vias later formed in the via holes 832, 834 and further conductive patterns and conductive vias subsequently formed over such conductive vias will be floating and will not be electrically coupled to the functional circuitry of the IC device 820.

In at least one embodiment, at least one of the recessed features 833, 835 partially extends into the corresponding ring portions 842, 844, without extending beyond the corresponding ring portions 842, 844, and without touching or connecting with other recessed features at the same level in the dielectric layer 830. As a result, conductive patterns later formed in the recessed features 833, 835 will not extend beyond the corresponding ring portions 842, 844, and will not touch or connect with other conductive patterns in the same metal layer.

In at least one embodiment, at least one of the ring portions 842, 844 includes one or more recessed features (not shown) in the dielectric layer 830. The recessed features in the ring portion 842 are not connected with other recessed features at the same level in the dielectric layer 830 but outside the ring portion 842. As a result, conductive patterns later formed in recessed features in the ring portion 842 will not be connected with other conductive patterns in the same metal layer but outside the ring portion 842. The recessed features in the ring portion 844 are not connected with other recessed features at the same level in the dielectric layer 830 but outside the ring portion 844. As a result, conductive patterns later formed in recessed features in the ring portion 844 will not be connected with other conductive patterns in the same metal layer but outside the ring portion 844. The number of via holes and recessed features shown in FIG. 8C is an example. In some embodiments, at least one of via holes 832, 834, 836 comprises multiple via holes, and/or at least one of recessed features 833, 835, 837 comprises multiple recessed features Operation 813 comprises filling a conductive material into the via holes and recessed features of the damascene structure 831, to correspondingly obtain conductive vias of a via layer and conductive patterns of a metal layer, wherein the conductive patterns are over and coupled to the conductive vias. For example, as show in FIG. 8D, a conductive material, e.g., a metal, is filled into the via holes 832, 834 836 and recessed features 833, 835, 837, to correspondingly obtain conductive vias 852, 854, 856 and conductive patterns 853, 855, 857. The conductive vias 852, 854, 856 belong to a via layer which, in at least one embodiment, corresponds to via layer Vn-4 as described with respect to FIG. 1B. The conductive material, after filling the via holes and recessed features in the damascene structure 831, forms an upper portion 850 on top of the resulting structure. The conductive patterns 853, 855, 857 belong to a metal layer which, in at least one embodiment, corresponds to metal layer Mn-3 as described with respect to FIG. 1B. In at least one embodiment, the conductive via 856 and conductive pattern 857 are electrically coupled to the functional circuitry of the IC device 820. In at least one embodiment, the conductive vias 852, 854 and conductive patterns 853, 855 are floating and is not electrically coupled to the functional circuitry of the IC device 820.

Operation 814 comprises a planarizing process. For example, as show in FIG. 8E, a planarizing process, for example, a chemical mechanical polish (CMP) process, is performed to remove the upper portion 850 of the conductive material. As a result, upper surfaces of the conductive patterns 853, 855, 857 and surrounding portions of the dielectric layer 830 are exposed for subsequent processing. The conductive patterns 853, 855, 857 are correspondingly over and coupled to the conductive vias 852, 854, 856. The conductive via 856 and conductive pattern 857 are electrically coupled to the functional circuitry of the IC device 820. The conductive via 852 and conductive pattern 853 are floating and surrounded by the ring portion 842. The conductive via 854 and conductive pattern 855 are floating and surrounded by the ring portion 844.

At operation 816, it is checked whether the interconnect formation process at operation 810 has been performed for N times, where N is a natural number greater than 1. The number N corresponds to the number of metal layers and/or via layers to be included in one or more tower structures to be formed, and depends on various design considerations and/or requirements including, but not limited to, mechanical strength requirements, antenna effect requirements, or the like.

When it is determined at operation 816 that the interconnect formation process at operation 810 has not been performed for N times, the interconnect formation process at operation 810 is performed again. As a result, a further dielectric layer, a further metal layer and a further via layer are formed over the existing structure of the IC device 820 being manufactured. For example, as show in FIG. 8F, a dielectric layer 870 is formed over the existing structure in FIG. 8E, and embeds therein conductive patterns 882, 884, 887 of a further metal layer and conductive vias 862, 864, 866 of a further via layer. In at least one embodiment, the further metal layer comprising the conductive patterns 882, 884, 887 corresponds to one of the metal layers Mn-2 to Mn as described with respect to FIG. 1B. In at least one embodiment, the further via layer comprising the conductive vias 862, 864, 866 corresponds to one of the via layers Vn-3 to Vn-1 as described with respect to FIG. 1B. The dielectric layers 830, 870 become parts of an ILD 890. The conductive via 866 and conductive pattern 887 are electrically coupled to the conductive pattern 857 and conductive via 856, and then to the functional circuitry of the IC device 820. The conductive via 862 and conductive pattern 882 are floating and surrounded by a ring portion 872 of the dielectric layer 870. The conductive via 864 and conductive pattern 884 are floating and surrounded by the ring portion 874 of the dielectric layer 870. The ring portions 872, 874 share a common boundary region 875. The conductive via 862 and conductive pattern 882 are coupled to the conductive via 852 and conductive pattern 853, to build up a tower structure 892. The conductive via 864 and conductive pattern 884 are coupled to the conductive via 854 and conductive pattern 855, to build up a tower structure 894. The ring portion 872 of the dielectric layer 870 is over the ring portion 842 of the dielectric layer 830, to build up a ring region 891 extending around the tower structure 892. The ring portion 874 of the dielectric layer 870 is over the ring portion 844 of the dielectric layer 830, to build up a ring region 893 extending around the tower structure 894.

As the interconnect formation process at operation 810 is repeatedly performed, the ILD 890 becomes thicker, the tower structures 892, 894 become higher, and the ring regions 891, 893 also become higher while continuing to extend around or surround the corresponding tower structures 892, 894. Further conductive patterns and/or conductive vias are also added over the conductive pattern 887 to electrically connect various circuits of the functional circuitry of the IC device 820, and/or to electrically couple the functional circuitry of the IC device 820 with an external device.

When it is determined at operation 816 that the interconnect formation process at operation 810 has been performed for N times, the process proceeds to operation 817. At this time, the structure of the IC device 820 comprises a plurality of tower structures surrounded by a plurality of corresponding ring regions, for example, as described with respect to tower structures 132, 134 surrounded corresponding ring regions 142, 144 in FIG. 1B.

At operation 817, further processing is performed. In an example of the further processing, a redistribution layer (RDL) 150, one or more under-bump-metallurgy (UBM) structures 160, and one or more bumps 162 are sequentially formed over the structure of the IC device 820 obtained after performing the interconnect formation process N times. As a result, the IC device 820 has a resulting structure corresponding to the structure of the IC device 100 described with respect to FIG. 1B. In the resulting structure of the IC device 820, a plurality of tower structures are surrounded by a plurality of corresponding ring regions. In the same metal layer, conductive patterns of adjacent tower structures are physically disconnected from each other, thereby limiting an amount of electrical charges accumulated during the manufacturing process and satisfying antenna effect requirements, as described with respect to one or more of FIGS. 1B-5C. The regions where the conductive patterns are disconnected from each other define various ring regions, as described herein. In at least one embodiment, one or more advantages described herein are achievable by an IC device manufactured by one or more of methods 600, 700, 800.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EDA system is usable as part of a design house of an IC manufacturing system discussed below.

Figure 9:
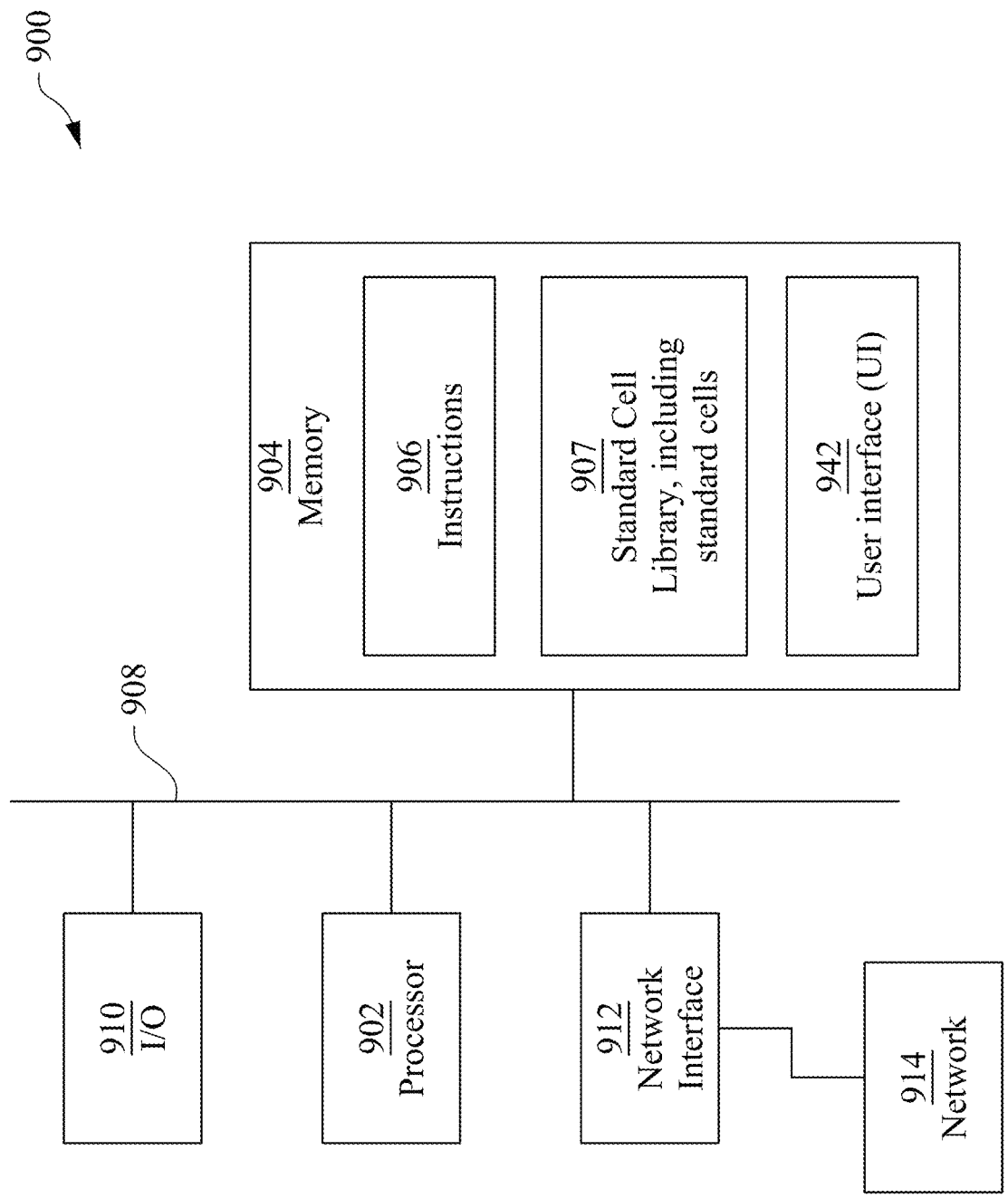
FIG. 9 is a block diagram of an electronic design automation (EDA) system in accordance with some embodiments.

FIG. 9 is a block diagram of an electronic design automation (EDA) system 900 in accordance with some embodiments.

In some embodiments, EDA system 900 includes an APR system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
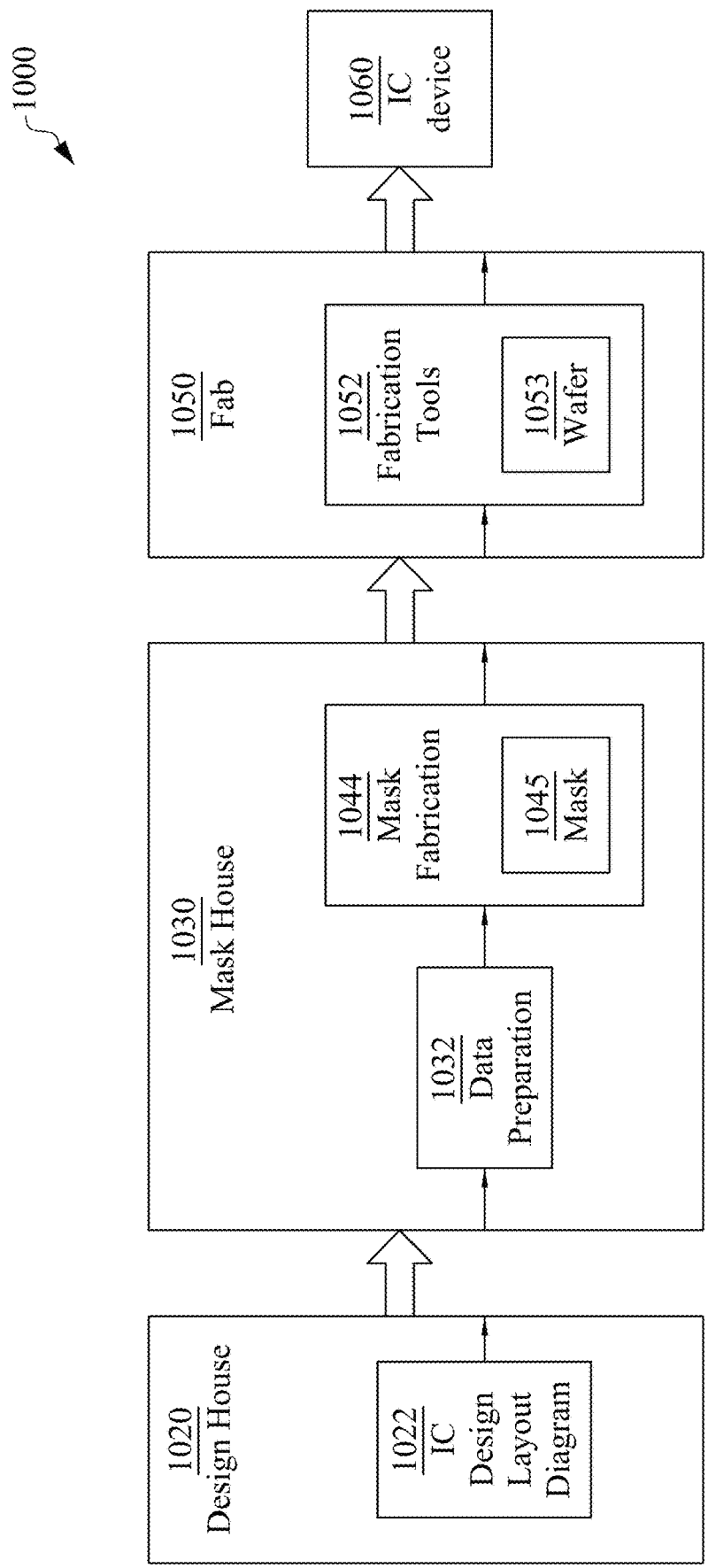
FIG. 10 is a block diagram of an IC device manufacturing system, and an IC manufacturing flow associated therewith, in accordance with some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place-and-route operation. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 includes fabrication tools 1052 configured to execute various manufacturing operations on semiconductor wafer 1053 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S.

Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an integrated circuit (IC) device comprises an interlayer dielectric (ILD), a first tower structure embedded in the ILD, and a first ring region comprising a portion of the ILD that extends around the first tower structure. The first tower structure comprises a plurality of first conductive patterns in a plurality of metal layers, and a plurality of first vias between the plurality of metal layers along a thickness direction of the IC device. The plurality of first conductive patterns and the plurality of first vias are coupled to each other to form the first tower structure. The plurality of first conductive patterns is confined by the first ring region, without extending beyond the first ring region. The first tower structure is a dummy tower structure.

In some embodiments, an integrated circuit (IC) device comprises an interlayer dielectric (ILD), a plurality of metal layers and a plurality of via layers embedded in the ILD and alternatingly arranged along a thickness direction of the IC device. At least one tower structure comprises a plurality of first conductive patterns in the plurality of metal layers, and a plurality of first vias in the plurality of via layers. The plurality of first conductive patterns and the plurality of first vias are coupled to each other to form the at least one tower structure. At least one ring region extends around the at least one tower structure, and comprises a portion of the ILD that extends around the at least one tower structure, and a plurality of second conductive patterns in the plurality of metal layers. The plurality of first conductive patterns is physically disconnected from the plurality of second conductive patterns.

A method in accordance with some embodiments comprises repeatedly performing an interconnect formation process. The interconnect formation process comprises depositing a dielectric layer over a substrate, patterning the dielectric layer to obtain a damascene structure having via holes and recessed features over the via holes, while leaving a ring portion of the dielectric layer extending around a portion of the damascene structure, and filling a conductive material into the via holes and the recessed features of the damascene structure, to correspondingly obtain conductive vias of a via layer and conductive patterns of a metal layer, the conductive patterns over and coupled to the conductive vias. The repeatedly performing the interconnect formation process results in a plurality of metal layers and a plurality of via layers alternatingly and sequentially formed over the substrate, and an interlayer dielectric (ILD) comprising a plurality of dielectric layers sequentially formed over the substrate. The metal layer with the conductive patterns obtained each time the interconnect formation process is performed corresponds to one of the plurality of metal layers. The via layer with the conductive vias obtained each time the interconnect formation process is performed corresponds to one of the plurality of via layers. The dielectric layer deposited and patterned each time the interconnect formation process is performed corresponds to one of the plurality of dielectric layers of the ILD. The plurality of metal layers and the plurality of via layers form a plurality of tower structures. Each tower structure comprises a plurality of conductive patterns in the plurality of metal layers, and a plurality of conductive vias in the plurality of via layers, wherein the plurality of conductive patterns and the plurality of conductive vias are coupled to each other to form the tower structure. The ring portions of the plurality of dielectric layers in the ILD are sequentially over each other to form a plurality of ring regions each extending around a corresponding tower structure among the plurality of tower structures. Each ring region physically disconnects the plurality of conductive patterns of the corresponding tower structure from the plurality of conductive patterns of other tower structures among the plurality of tower structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
an interlayer dielectric (ILD);
a first tower structure embedded in the ILD and comprising:
a plurality of first conductive patterns in a plurality of metal layers; and
a plurality of first vias between the plurality of metal layers along a thickness direction of the IC device, wherein the plurality of first conductive patterns and the plurality of first vias are coupled to each other to form the first tower structure; and
a first ring region comprising a portion of the ILD that extends around the first tower structure,
wherein
the plurality of first conductive patterns is confined by the first ring region, without extending beyond the first ring region, and
the plurality of first conductive patterns and the plurality of first vias in the first tower structure are floating.

2. The IC device of claim 1, further comprising:
an under-bump-metallurgy (UBM) structure overlapping the first tower structure in the thickness direction,
wherein the UBM structure is electrically isolated from the first tower structure.

3. The IC device of claim 2, further comprising:
a redistribution layer (RDL) between the first tower structure and the UBM structure along the thickness direction,
wherein the RDL is electrically coupled to the UBM structure, and is electrically isolated from the first tower structure.

4. The IC device of claim 1, further comprising:
a second tower structure comprising:
a plurality of second conductive patterns in the plurality of metal layers; and
a plurality of second vias between the plurality of metal layers along the thickness direction, wherein the plurality of second conductive patterns and the plurality of second vias are coupled to each other to form the second tower structure,
wherein
the plurality of first conductive patterns is physically disconnected from the plurality of second conductive patterns by the first ring region, and
the plurality of second conductive patterns and the plurality of second vias in the second tower structure are floating.

5. The IC device of claim 4, further comprising:
a under-bump-metallurgy (UBM) structure overlapping, in the thickness direction, the first tower structure, the second tower structure, and the first ring region,
wherein the UBM structure is electrically isolated from the first tower structure and the second tower structure.

6. The IC device of claim 4, further comprising:
a second ring region comprising a further portion of the ILD that extends around the second tower structure,
wherein
the plurality of second conductive patterns is confined by the second ring region, without extending beyond the second ring region,
the first ring region and the second ring region are continuous with each other,
the first ring region extends around the first tower structure, without extending around the second tower structure, and
the second ring region extends around the second tower structure, without extending around the first tower structure.

7. The IC device of claim 6, wherein
the first ring region and the second ring region share a boundary region across which a first conductive pattern among the plurality of first conductive patterns is aligned with and physically disconnected from a corresponding second conductive pattern among the plurality of second conductive patterns, and
the corresponding first and second conductive patterns are in a same metal layer among the plurality of metal layers.

8. The IC device of claim 1, wherein
the first tower structure comprises, in each metal layer of the plurality of metal layers, multiple first conductive patterns among the plurality of first conductive patterns, and
the multiple first conductive patterns in said each metal layer are at a same level along the thickness direction of the IC device.

9. An integrated circuit (IC) device, comprising:
an interlayer dielectric (ILD);
a plurality of metal layers and a plurality of via layers embedded in the ILD, and alternatingly arranged along a thickness direction of the IC device;
at least one tower structure comprising:
  a plurality of first conductive patterns in the plurality of metal layers; and
  a plurality of first vias in the plurality of via layers, wherein the plurality of first conductive patterns and the plurality of first vias are coupled to each other to form the at least one tower structure; and
at least one ring region extending around the at least one tower structure, the at least one ring region comprising:
  a portion of the ILD that extends around the at least one tower structure, and
  a plurality of second conductive patterns in the plurality of metal layers,
wherein the plurality of first conductive patterns is physically disconnected from the plurality of second conductive patterns.

10. The IC device of claim 9, wherein
the plurality of via layers further comprises a plurality of second vias, and
the plurality of second conductive patterns and the plurality of second vias are coupled to each other.

11. The IC device of claim 9, wherein at least one of
the plurality of first conductive patterns is floating,
the plurality of second conductive patterns is floating, or
the plurality of first conductive patterns is electrically disconnected from the plurality of second conductive patterns.

12. The IC device of claim 9, wherein
the at least one tower structure comprises a plurality of tower structures,
the at least one ring region comprises a plurality of ring regions each extending around a corresponding tower structure among the plurality of tower structures, without extending around any other tower structure among the plurality of tower structures, and
the plurality of ring regions is continuous to each other.

13. The IC device of claim 12, wherein
the plurality of ring regions is connected with each other in a lattice pattern or a grid.

14. The IC device of claim 9, wherein, in a plan view along the thickness direction of the IC device,
at least one of
  a perimeter of each second conductive pattern among the plurality of second conductive patterns is from 1.5 to 5 times a width of the ring region, or
  the width of the ring region is not less than a longest dimension of each second conductive pattern among the plurality of second conductive patterns.

15. The IC device of claim 9, wherein
in a metal layer among the plurality of metal layers, multiple first conductive patterns among the plurality of first conductive patterns of the tower structure are at a same level along the thickness direction of the IC device, and are aligned with, and spaced by, a spacing from corresponding multiple second conductive patterns among the plurality of second conductive patterns in the ring region, and
at least one of
  the spacing is in the ring region, or
  the IC device further comprises a under-bump-metallurgy (UBM) structure overlapping the tower structure and the spacing in the thickness direction.

16. The IC device of claim 9, wherein
a metal layer among the plurality of metal layers comprises multiple first conductive patterns among the plurality of first conductive patterns,
the multiple first conductive patterns are elongated along a first direction, and are arranged at a pitch along a second direction transverse to the first direction, and
at least one of
  a width of the tower structure surrounded by the ring region is from 500 to 1500 times the pitch, or
  a width of the ring region is from 15 to 150 times the pitch.

17. The IC device of claim 9, further comprising:
a under-bump-metallurgy (UBM) structure overlapping the tower structure in the thickness direction,
wherein, in a plan view along the thickness direction of the IC device,
  a metal layer among the plurality of metal layers comprises multiple first conductive patterns among the plurality of first conductive patterns, and
  a total area of the multiple first conductive patterns overlapped by a bumping area of the UBM structure in the thickness direction is from 0.5 to 0.9 times the bumping area.

18. A method, comprising:
repeatedly performing an interconnect formation process which comprises:
  depositing a dielectric layer over a substrate;

patterning the dielectric layer to obtain a damascene structure having via holes and recessed features over the via holes, while leaving a ring portion of the dielectric layer extending around a portion of the damascene structure; and filling a conductive material into the via holes and the recessed features of the damascene structure, to correspondingly obtain conductive vias of a via layer and conductive patterns of a metal layer, the conductive patterns over and coupled to the conductive vias, wherein said repeatedly performing the interconnect formation process results in a plurality of metal layers and a plurality of via layers alternatingly and sequentially formed over the substrate along a thickness direction of the substrate, and an interlayer dielectric (ILD) comprising a plurality of dielectric layers sequentially formed over the substrate along the thickness direction of the substrate, the metal layer with the conductive patterns obtained each time the interconnect formation process is performed corresponds to one of the plurality of metal layers, the via layer with the conductive vias obtained each time the interconnect formation process is performed corresponds to one of the plurality of via layers, the dielectric layer deposited and patterned each time the interconnect formation process is performed corresponds to one of the plurality of dielectric layers of the ILD, the plurality of metal layers and the plurality of via layers form a plurality of tower structures, each comprising:

a plurality of conductive patterns in the plurality of metal layers, wherein each metal layer of the plurality of metal layers comprises, among the plurality of conductive patterns, multiple conductive patterns at a same first level along the thickness direction of the substrate; and a plurality of conductive vias in the plurality of via layers, wherein the plurality of conductive patterns and the plurality of conductive vias are coupled to each other to form the tower structure, and each via layer of the plurality of via layers comprises, among the plurality of conductive vias, multiple conductive vias at a same second level along the thickness direction of the substrate, and the ring portions of the plurality of dielectric layers in the ILD are sequentially over each other to form a plurality of ring regions each extending around a corresponding tower structure among the plurality of tower structures, and physically disconnecting the plurality of conductive patterns of the corresponding tower structure from the plurality of conductive patterns of other tower structures among the plurality of tower structures.

19. The method of claim 18, wherein, in each tower structure among the plurality of tower structures, the plurality of conductive patterns and the plurality of conductive vias are floating.

20. The method of claim 19, wherein each ring region among the plurality of ring regions extends around the corresponding tower structure, without extending around the other tower structures among the plurality of tower structures.

\* \* \* \* \*